United States Patent
Fujiyoshi et al.

(10) Patent No.: US 10,331,409 B2
(45) Date of Patent: Jun. 25, 2019

(54) SINE WAVE MULTIPLICATION DEVICE AND INPUT DEVICE HAVING THE SAME

(71) Applicant: ALPS ALPINE CO., LTD., Tokyo (JP)

(72) Inventors: Tatsumi Fujiyoshi, Miyagi (JP); Shinichi Sagawai, Miyagi (JP); Kiyoshi Sasai, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 15/713,903

(22) Filed: Sep. 25, 2017

(65) Prior Publication Data
US 2018/0012045 A1 Jan. 11, 2018

Related U.S. Application Data

(63) Continuation of application No. PCT/JP2016/060948, filed on Apr. 1, 2016.

(30) Foreign Application Priority Data

Apr. 14, 2015 (JP) .................. 2015-082584

(51) Int. Cl.
*G06F 7/548* (2006.01)
*G06G 7/16* (2006.01)
*H03D 7/14* (2006.01)

(52) U.S. Cl.
CPC ............... *G06F 7/548* (2013.01); *G06G 7/16* (2013.01); *H03D 7/1425* (2013.01);
(Continued)

(58) Field of Classification Search
CPC ........ G06G 7/16; G06G 7/161; H03D 7/1466; H03D 7/1475
See application file for complete search history.

(56) References Cited

U.S. PATENT DOCUMENTS

| | | | |
|---|---|---|---|
| 4,295,105 A | 10/1981 | Bingham | |
| 4,616,185 A * | 10/1986 | van Roermund | .... H03H 19/004 327/355 |

(Continued)

FOREIGN PATENT DOCUMENTS

| | | |
|---|---|---|
| JP | S60-229672 | 11/1985 |
| JP | H10-335938 | 12/1998 |

(Continued)

OTHER PUBLICATIONS

Partial Supplementary European Search Report for 16779937.8 dated Mar. 27, 2018.

(Continued)

*Primary Examiner* — Chuong D Ngo
(74) *Attorney, Agent, or Firm* — IPUSA, PLLC

(57) ABSTRACT

Provided is a sine wave multiplication device of simple configuration, broad input signal level range, and minimal fluctuation in characteristics due to temperature. A signal component that corresponds to a product of an input signal Si and the third harmonic wave of a first square wave W1 included in an output signal Su1; and a signal component that corresponds to a product of the input signal Si and the fifth harmonic wave of the first square wave W1 is canceled by: a signal component that corresponds to a product of the input signal Si and the fundamental wave of a second square wave W2 included in an output signal Su2; and a signal component that corresponds to a product of the input signal Si and the fundamental wave of a second square wave W3 included in an output signal Su3.

8 Claims, 19 Drawing Sheets

(52) U.S. Cl.
CPC ......... *H03D 7/1466* (2013.01); *H03D 7/1483* (2013.01); *H03D 2200/006* (2013.01); *H03D 2200/0074* (2013.01); *H03D 2200/0086* (2013.01)

(56) References Cited

U.S. PATENT DOCUMENTS

| | | |
|---|---|---|
| 4,789,837 A | 12/1988 | Ridgers |
| 2006/0027019 A1 | 2/2006 | Ito et al. |
| 2006/0040634 A1 | 2/2006 | Wang |
| 2008/0194222 A1 | 8/2008 | Liu et al. |
| 2011/0183639 A1 | 7/2011 | Morishita |
| 2013/0169342 A1 | 7/2013 | Cho et al. |

FOREIGN PATENT DOCUMENTS

| | | |
|---|---|---|
| JP | 2000-315919 | 11/2000 |
| JP | 2003-078353 | 3/2003 |
| JP | 2005-536099 | 11/2005 |
| WO | 2004/015439 | 2/2004 |
| WO | 2010/064450 | 6/2010 |
| WO | 2014/015277 | 1/2014 |

OTHER PUBLICATIONS

International Search Report dated Jun. 21, 2016 in PCT/JP2016/060948 filed on Apr. 1, 2016.
Extended European Search Report for 16779937.8 dated Sep. 6, 2018.

* cited by examiner

FIG.2A
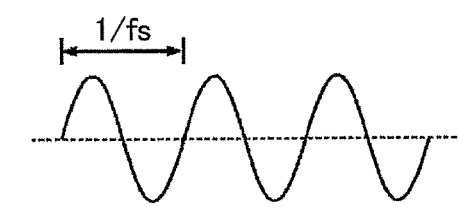
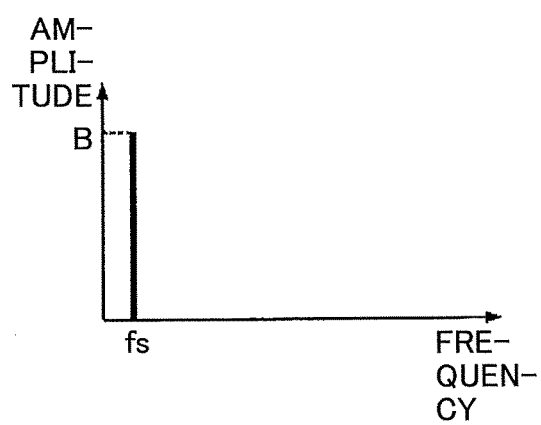
FIG.2B
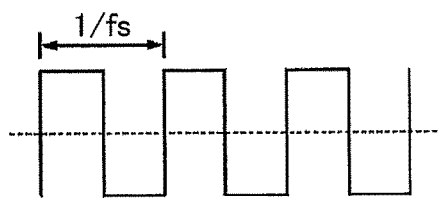
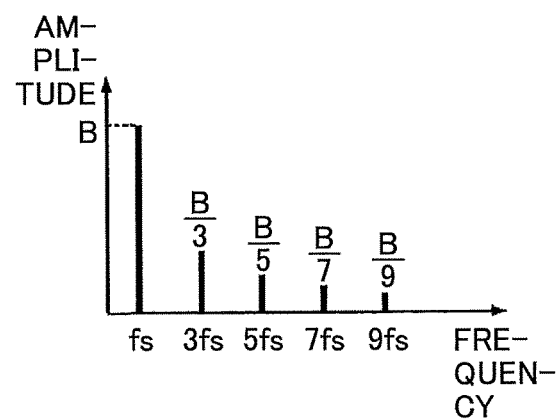

U1 ~ U3

UA1 ~ UA3

UB1 ~ UB3

SINE WAVE MULTIPLICATION DEVICE AND INPUT DEVICE HAVING THE SAME

CROSS-REFERENCE TO RELATED APPLICATIONS

The present application is a continuation application of International Application No. PCT/JP2016/060948 filed on Apr. 1, 2016, which claims priority to Japanese Patent Application No. 2015-082584 filed on Apr. 14, 2015. The contents of these applications are incorporated herein by reference in their entirety.

BACKGROUND OF THE INVENTION

1. Field of the Invention

The present invention is related to a sine wave multiplication device for multiplying an input signal by a sine wave and related to an input device having the sine wave multiplication device.

2. Description of the Related Art

In case of multiplying an input signal by a sine wave, typically, a method that uses an analog multiplier such as a Gilbert cell is used (refer to Patent Document 1).

CITATION LIST

Patent Document

[Patent Document 1] Japanese Unexamined Patent Application Publication No. 2000-315919

SUMMARY OF THE INVENTION

Technical Problem

A Gilbert cell analog multiplier has been implemented for practical use in a configuration as shown, for example, in FIG. 1 in Patent Document 1. In the case where a Gilbert cell is composed of a bipolar transistor, a thermal voltage VT is included as a coefficient in a multiplication result as illustrated in formula (14) or formula (20) in Patent Document 1. The thermal voltage VT is represented by "k*T/q", where k is a Boltzmann constant, T is an absolute temperature, and q is an elementary charge of the electron. Therefore, the multiplication result of the Gilbert cell, i.e., an output voltage, varies according to the temperature. This applies equally well to other analog multipliers composed of a MOS transistor. Further, in an analog multiplier, due to the non-linearity of input/output characteristics of a transistor, it is necessary to limit an input voltage range in order to secure multiplication accuracy. According to the above, in case of using an analog multiplier in, for example, an electrostatic capacitance-type input device, there are issues such as securing a signal dynamic range or dealing with a fluctuation caused by temperature.

Further, in case of using an analog multiplier for multiplying by a sine wave, it is necessary to generate a sine wave separately. Therefore, for example, in order to perform accurate signal extraction by multiplying an input signal by a sine wave, it is necessary to generate a sine wave accurately, and thus, there is a problem in that the circuit size for generating a sine wave increases, and thus, the power consumption increases.

The present invention has been made in view of the above, and an object of the present invention is to provide a sine wave multiplication device having a simple configuration, having a wide range of an input signal level, and having little fluctuation of characteristics due to the temperature.

Solution to Problem

A first aspect of the present invention relates to a sine wave multiplication device for multiplying an input signal by a sine wave having a predetermined frequency. The sine wave multiplication device includes a plurality of square wave multiplication units that multiplies the input signal by square waves having frequencies different from each other and a signal synthesis unit that synthesizes output signals of the square wave multiplication units. A square wave can be approximated as a sum of a fundamental wave that is a sine wave whose frequency is the lowest and a plurality of harmonic waves that are sine waves having frequencies of integer multiples of the fundamental wave. The square wave multiplication units include a first square wave multiplication unit and one or more second square wave multiplication units. The first square wave multiplication unit multiplies the input signal by a first square wave that has, as the fundamental wave, a sine wave having the predetermined frequency. The second square wave multiplication unit multiplies the input signal by a second square wave that has, as the fundamental wave, a sine wave that is the same as one of the harmonic waves included in the first square wave or a sine wave whose phase is inverted from that of the one of the harmonic waves. The signal synthesis unit cancels a signal component corresponding to a product of at least one of the harmonic waves of the first square wave included in the output signal of the first square wave multiplication unit and the input signal, by a signal component corresponding to a product of the fundamental wave of the second square wave included in the output signal of the second square wave multiplication unit and the input signal.

According to the above arrangement, the signal component corresponding to a product of at least one of the harmonic waves of the first square wave included in the output signal of the first square wave multiplication unit and the input signal is canceled by the signal component corresponding to a product of the fundamental wave of the second square wave included in the output signal of the second square wave multiplication unit and the input signal. Therefore, in a signal of a synthesis result of the signal synthesis unit, signal components corresponding to products of the harmonic waves of the first square wave and the input signal are decreased, and a signal component corresponding to a product of the fundamental wave of the first square wave (the sine wave having the predetermined frequency) and the input signal is caused to be a dominant component. In the above-described sine wave multiplication device, the square wave multiplication unit is used for multiplying the input signal by a sine wave (the fundamental wave of the first square wave), and thus, unlike an analog multiplier, the above-described sine wave multiplication device tends not to be affected by the temperature characteristics of transistors, and thus, there is little fluctuation of characteristics due to the temperature in the sine wave multiplication device. Further, by using the square wave multiplication device, unlike an analog multiplier, the sine wave multiplication device tends not to be affected by input/output non-linear characteristics of transistors, and thus, the range of input signal level becomes wider. Furthermore, in the above-described sine wave multiplication device, by using the square wave multiplication unit, a sine wave generator can be omitted, and thus, the circuit configuration becomes simpler.

Preferably, the square wave multiplication unit may generate an output signal proportional to the input signal in each of one of the half cycles and the other of the half cycles of a cycle of the square wave by which the input signal is multiplied, in such a way that an absolute value of a ratio between the input signal and the output signal in the one of the half cycles is the same as that in the other of the half cycles, and that a sign of the ratio in the one of the half cycles is opposite to that in the other of the half cycles. According to the above, in the square multiplication unit, the output signal is generated in such a way that an absolute value of a ratio between the input signal and the output signal in one of the half cycles of a cycle of the square wave by which the input signal is multiplied, is the same as that in the other of the half cycles, and a sign of the ratio in the one of the half cycles is opposite to that in the other of the half cycles. In other words, multiplication of the input signal and the square wave is performed by maintaining the absolute value of the ratio of the output signal with respect to the input signal and by inverting the positive/negative sign of the ratio at every half cycle of the square wave. Therefore, it is possible to avoid receiving effects of the temperature characteristics and the input/output non-linear characteristics of transistors, which effects an analog multiplier tends to receive.

Preferably, in each of the one of the half cycles and the other of the half cycles in a cycle of the square wave by which the input signal is multiplied, the square wave multiplication unit may repeat, alternately at a predetermined sampling cycle, a charging operation for accumulating an electric charge proportional to a voltage of the input signal and an electric charge outputting operation for outputting the electric charge accumulated by the charging operation to the signal synthesis unit, in such a way that a ratio between the voltage of the input signal and an electric charge amount accumulated by the charging operation in the one of the half cycles may be equal to that in the other of the half cycles, and that polarity of the electric charge output to the signal synthesis unit in the one of the half cycles may be opposite to that in the other of the half cycles. Every time when a predetermined number of electric charge outputting operations are performed by the square wave multiplication units, the signal synthesis unit may generate an output signal corresponding to a sum of electric charges output from the square wave multiplication units according to the electric charge outputting operations.

Preferably, the first square wave multiplication unit and the second square multiplication unit may have at least one capacitor that accumulates an electric charge in the charging operation. In this case, a ratio between a capacitance of the capacitor in which an electric charge is accumulated in the charging operation by the first square wave multiplication unit and a capacitance of the capacitor in which an electric charge is accumulated in the charging operation by the second square wave multiplication unit, may have a value corresponding to a ratio between an amplitude of the fundamental wave of the first square wave and an amplitude of the harmonic wave of the first square wave that has a frequency equal to the fundamental wave of the second square wave.

According to the above-described configuration, the ratio between the electric charge output from the first square wave multiplication unit in the electric charge outputting operation and the electric charge output from the second square wave multiplication unit has a value corresponding to the ratio between the capacitance of the capacitor of the first square wave multiplication unit and the capacitance of the capacitor of the second square wave multiplication unit. Further, the ratio of the capacitances has a value corresponding to a ratio between an amplitude of the fundamental wave of the first square wave and an amplitude of the harmonic wave of the first square wave that has the same frequency as the fundamental wave of the second square wave. Therefore, by adding the electric charge output from the first square wave multiplication unit and the electric charge output from the second square wave multiplication unit, it is possible to cancel a signal component corresponding to a product of the harmonic wave of the first square wave and the input signal by a signal component corresponding to a product of the fundamental wave of the second square wave and the input signal. Further, because a capacitance ratio of the capacitors tends not to be affected by variations due to the temperature and manufacturing processes, it is possible to accurately perform canceling the signal components.

Preferably, the sine wave multiplication device may include an input node to which the input signal is input and an output node to which outputs of the square wave multiplication units are connected in common. The square wave multiplication unit may include a first capacitor; a second capacitor; a first switch unit that repeats, alternately at the sampling cycle, a charging operation for connecting one end of the first capacitor to the input node and for connecting the other end of the first capacitor to a reference potential and an electric charge outputting operation for connecting the one end of the first capacitor to the output node and for connecting the other end of the first capacitor to the reference potential in one of the half cycles of a cycle of the square wave by which the input signal is multiplied; a second switch unit that repeats, alternately at the sampling cycle, a charging operation for connecting one end of the second capacitor to the input node and for connecting the other end of the second capacitor to the output node and an electric charge outputting operation for connecting the other end of the second capacitor to the output node and for connecting the one end of the second capacitor to the reference potential in the other of the half cycles of a cycle of the square wave by which the input signal is multiplied. The signal synthesis unit may include a third capacitor one terminal of which is connected to the output node, an amplifier circuit that controls a voltage of the other terminal of the third capacitor in such a way that a voltage difference between the output node and the reference potential is caused to be zero, and a discharging circuit that discharges an electric charge accumulated in the third capacitor.

Preferably, the first switch unit may include a first switch element that is provided on a current path between the input node and the one end of the first capacitor and a second switch element that is provided on a current path between the one end of the first capacitor and the output node. The other end of the first capacitor may be connected to the reference potential. The second switch unit may include a third switch element that is provided on a current path between the input node and the one end of the second capacitor, a fourth switch element that is provide on a current path between the other end of the second capacitor and the reference potential, a fifth switch element that is provided on a current path between the other end of the second capacitor and the output node, and a sixth switch element that is provided on a current path between the one end of the second capacitor and the reference potential. In one of the half cycles of a cycle of the square wave by which the input signal is multiplied, at the time of the charging operation, the first switch element may be turned ON and the remaining switch elements may be turned OFF, and at the time of the electric charge outputting operation, the second switch element may be turned ON and the remaining switch elements may be turned OFF. In the other of the half cycles of a cycle of the square wave by which the input signal is multiplied, at the time of the charging operation, the third switch element and the fourth switch element may be turned ON and the remaining switch elements may be turned OFF, and at the time of the electric charge outputting operation, the fifth switch element and the sixth switch element may be turned ON and the remaining switch elements may be turned OFF.

The square wave multiplication unit may include a fourth capacitor that is provided on a current path between the first switch element and the input node. The first switch unit may include a seventh switch element that is provided on a current path between one end of the fourth capacitor and the input node, an eighth switch element that is provide on a current path between the one end of the fourth capacitor and the reference potential, and a ninth switch element that is provided on a current path between the other end of the fourth capacitor and the reference potential. The seventh switch element may be turned ON or OFF under the same condition as the first switch element. The eighth switch element and the ninth switch element may be turned ON or OFF under the same conditions as the second switch element.

Preferably, the sine wave multiplication device may include a first low-pass filter that attenuates a noise component, included in the input signal that is input to the square wave multiplication units, that may generate an aliasing noise into a signal band of the input signal from frequencies that are integer multiples of the sampling frequency. According to the above, the aliasing noise in a signal generated in the signal synthesis unit is decreased.

Preferably, the input signal and an inverted input signal whose polarity is opposite to the input signal are input to the square wave multiplication unit, and the square wave multiplication unit generates an output signal proportional to the input signal by a predetermined factor by a predetermined factor in one of the half cycles of a cycle of a square wave by which the input signal is multiplied, and generates an output signal proportional to the inverted input signal by the predetermined factor in the other of the half cycles of the cycle. For example, the square wave multiplication unit may generate an output current proportional to a voltage of the input signal by a predetermined factor in one of the half cycles of a cycle of a square wave by which the input signal is multiplied, and may generate an output current proportional to a voltage of the inverted input signal by the predetermined factor in the other of the half cycles of the cycle. The signal synthesis unit may generate a signal corresponding to a sum of the output currents output from the square wave multiplication units.

Preferably, the sine wave multiplication device may include N number of the square wave multiplication units that multiplies the input signal by N patterns of the second square waves corresponding to the first to Nth harmonic waves, in order from lowest frequency, included in the first square wave; and a second low-pass filter that attenuates the (N+1)th harmonic wave and the following harmonic waves, in order from lowest frequency, included in the first square wave in a signal output as a synthesis result by the signal synthesis unit.

According to the above, in a signal generated by the signal synthesis unit, signal components corresponding to the harmonic waves of the first square wave are decreased.

The second aspect of the present invention relates to an input device for inputting information corresponding to proximity of an object. The input device includes a sensor unit that includes a sensor element whose capacitance is changed according to the proximity of the object; a first sine wave multiplication unit that multiplies a direct current signal by a sine wave having a predetermined frequency and outputs a first sine wave having the predetermined frequency as a result of the multiplication; a detection signal generation unit that applies a drive voltage of a sine wave corresponding to the first sine wave, and generates a detection signal corresponding to a current that flows in the sensor element according to the application of the drive voltage; a second sine wave multiplication unit that multiplies the detection signal by a second sine wave having the predetermined frequency; and a low-pass filter that extracts a direct current component from a signal of the multiplication result of the second sine wave multiplication unit. The first sine wave multiplication unit and the second sine wave multiplication unit are the sine wave application device according to the first aspect.

Advantageous Effects of Invention

According to an embodiment of the present invention, it is possible to have a wider range of an input signal level and to decrease fluctuation of characteristics due to the temperature.

BRIEF DESCRIPTION OF THE DRAWINGS

FIG. 1A is a block diagram, and FIG. 1B is an example of a circuit configuration.

FIGS. 2A-2B are drawings illustrating frequency components of a sine wave and a square wave. FIG. 2A illustrates frequency components of a sine wave, and FIG. 2B illustrates frequency components of a square wave.

FIG. 3 (A) illustrates frequency components of a square wave that has a predetermined frequency, and FIG. 3 (B) and FIG. 3 (C) illustrate frequency components of square waves that include fundamental waves that are the same as harmonic waves of the square wave in FIG. 3 (A).

DETAILED DESCRIPTION OF THE PREFERRED EMBODIMENTS

First, an overview of a method for multiplying an input signal by a sine wave in a sine wave multiplication device according to an embodiment of the present invention will be described.

Figure 1A:
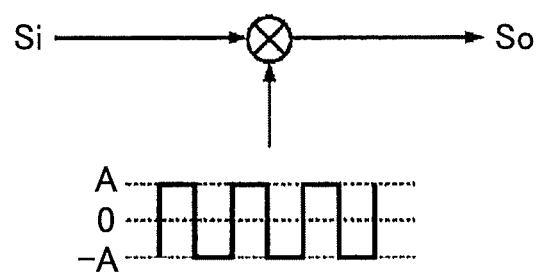
FIGS. 1A-1B are drawings illustrating a configuration example of a circuit for multiplying an input signal by a square wave.
Figure 1B:
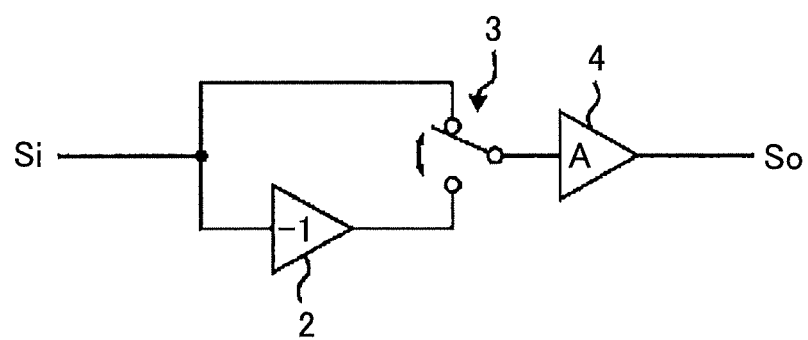

FIGS. 1A-1B are drawings illustrating a configuration example of a circuit for multiplying an input signal Si by a square wave. The square wave multiplication can be implemented by, different from the sine wave multiplication, a simpler circuit that uses fixed gain amplifier circuits 2, 4 and a switch circuit 3 as illustrated in, for example, FIG. 1B. In the square wave multiplication circuit illustrated in FIG. 1B, the input signal Si, or a signal in which the input signal Si is inverted by an amplifier circuit 2 having gain "−1", is input to an amplifier circuit 4 having gain A via a switch circuit 3. In one of the half cycles of a square wave, the input signal Si is amplified by the amplifier circuit 4 having gain A (multiplied by A), in the other of the half cycles of a square wave, the input signal Si is amplified by the amplifier circuit 4 having gain A and the amplifier circuit 2 having gain "−1" (multiplied by −A).

FIGS. 2A-2B are drawings illustrating frequency components of a sine wave and a square wave. The sine wave includes a single frequency component as illustrated in FIG. 2A. The square wave includes a fundamental wave and harmonic waves as illustrated in FIG. 2B. Therefore, a signal of a multiplication result of a square wave illustrated in FIGS. 1A-1B is a signal in which a signal component obtained by multiplying the input signal Si by the fundamental wave (input signal Si*fundamental wave) and a signal component obtained by multiplying the input signal Si by the harmonic waves (input signal Si*harmonic waves) are superimposed.

As illustrated in FIGS. 1A-1B, a circuit configuration for square wave multiplication is simpler, and has an advantage in that, unlike a case of using an analog multiplier, the square wave multiplication tends not to be affected by input/output non-linear characteristics and temperature characteristics of transistors. However, in a signal of a multiplication result of a square wave, signal components of harmonic waves (input signal Si*harmonic waves) are included as described above, and thus, the signal of a multiplication result of a square wave cannot be used as is as a multiplication result of the input signal Si and a sine wave. Therefore, in a sine wave multiplication device according to an embodiment of the present invention, a plurality of circuits for multiplying the input signal by square waves are provided, and, by synthesizing outputs of the circuits, unnecessary signal components included in the multiplication results of the input signal and the square waves (input signal*harmonic waves) are canceled.

Figure 3:
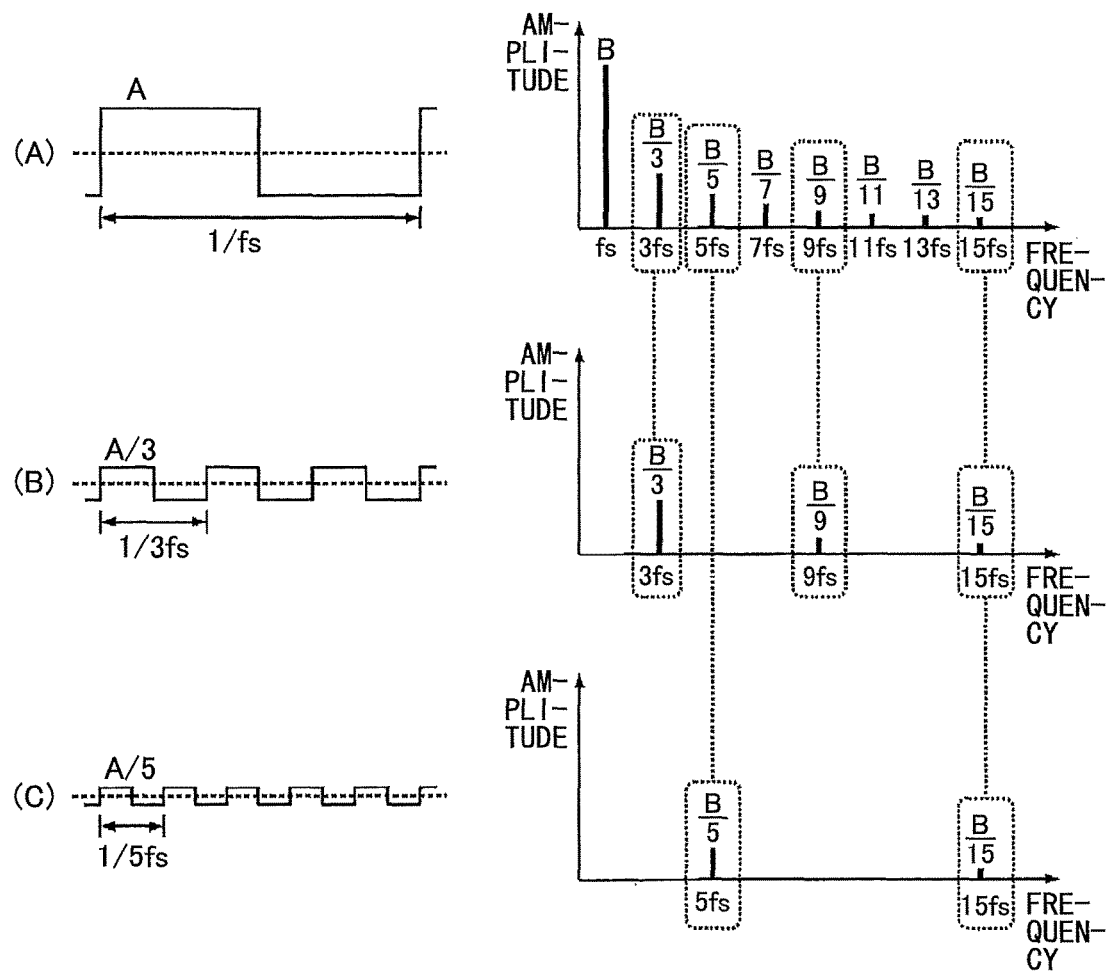
FIG. 3 is a drawing illustrating frequency components of square waves.

FIG. 3 is a drawing illustrating frequency components of square waves. FIG. 3 (A) illustrates frequency components of a square wave having frequency fs. FIG. 3 (B) illustrates frequency components of a square wave that has three times the frequency of the square wave in FIG. 3 (A) (3fs) and has a third of the amplitude of the square wave in FIG. 3 (A) (A/3). Further, FIG. 3 (C) illustrates frequency components of a square wave that has five times the frequency of the square wave in FIG. 3 (A) (5fs) and has a fifth of the amplitude of the square wave in FIG. 3 (A) (A/5).

In the square wave that has frequency fs, a fundamental wave that has frequency fs and harmonic waves that have odd multiples of the fundamental frequency (3fs, 5fs, 7fs, . . . ) are included. When an amplitude of the fundamental wave is "B", an amplitude of a harmonic wave that has frequency "K*fs" (hereinafter, referred to as "Kth harmonic wave") is "B/K". A fundamental wave in a square wave that has frequency 3fs and an amplitude B/3 illustrated in FIG. 3 (B) is the same as the third harmonic wave in a square wave that has frequency fs and amplitude B illustrated in FIG. 3 (A). Further, a fundamental wave in a square wave that has frequency 5fs and an amplitude B/5 illustrated in FIG. 3 (C) is the same as the fifth harmonic wave in a square wave that has frequency fs and amplitude B illustrated in FIG. 3 (A).

Therefore, components of the third harmonic wave and the fifth harmonic wave in the square wave that has frequency fs can be canceled by not only multiplying the input signal Si by the square wave illustrated in FIG. 3 (A), but also multiplying the input signal Si by the square waves that have inverted phases of the square waves illustrated in FIG. 3 (B) and FIG. 3 (C) and synthesizing the multiplication results. As described above, in a sine wave multiplication device according to the present embodiment, multiplying the input signal by a sine wave is implemented, instead of by directly multiplying the input signal by a sine wave by using an analog multiplier, by multiplying the input signal by a plurality of square waves and synthesizing the multiplication results. As a result, the sine wave multiplication device tends not to be affected by the temperature characteristics and the input/output non-linear characteristics of transistors, and the circuit configuration is simpler.

Next, embodiments of the present invention will be described while making reference to the drawings.

First Embodiment

Figure 4:
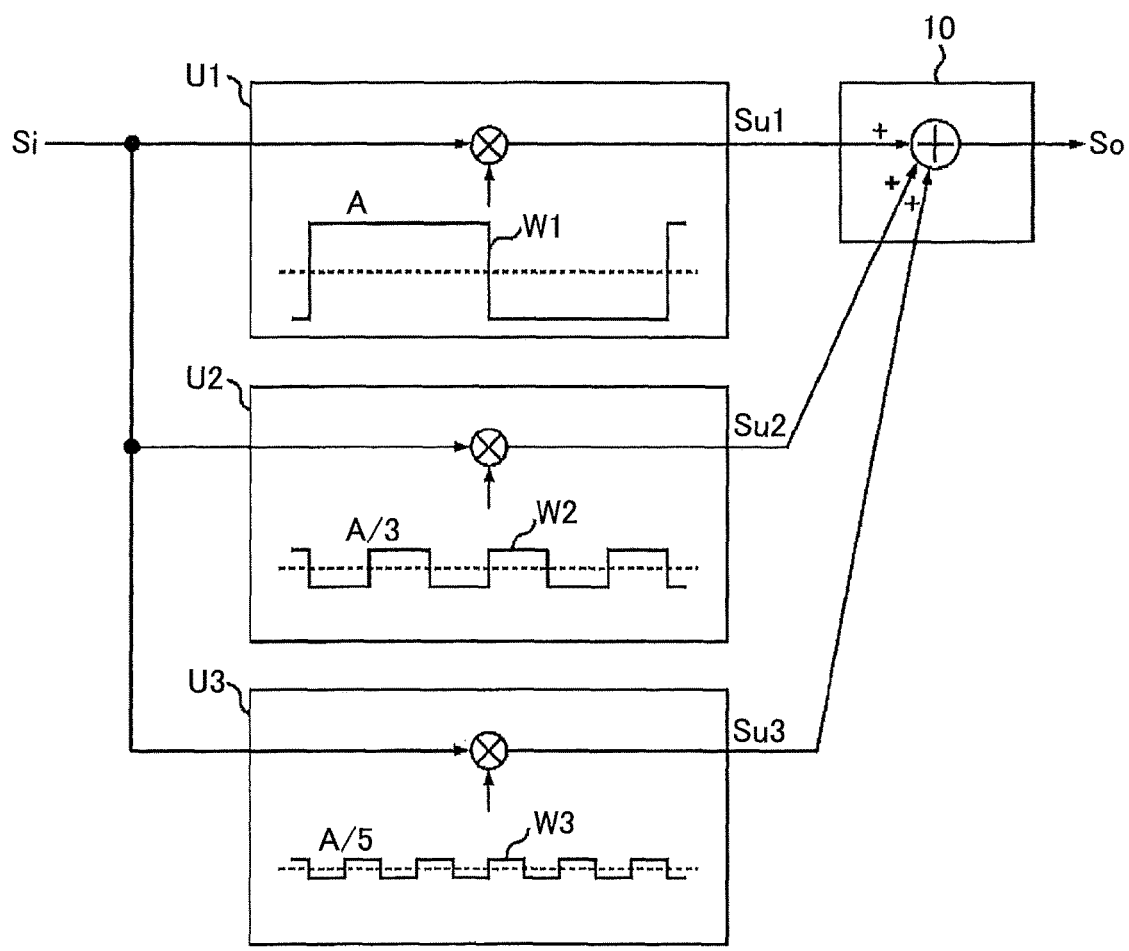
FIG. 4 is a drawing illustrating an example of a configuration of a sine wave multiplication device according to a first embodiment of the present invention.

FIG. 4 is a drawing illustrating an example of a configuration of a sine wave multiplication device according to a first embodiment of the present invention. The sine wave multiplication device illustrated in FIGS. 1A-1B includes three (3) square wave multiplication units U1, U2, U3 that multiply an input signal Si by square waves W1, W2, W3 that have frequencies different from each other, and a signal synthesis unit 10 that synthesizes output signals Su1, Su2, Su3 of the square wave multiplication units U1, U2, U3. In the following, any one of the square wave multiplication units U1-U3 is referred to as a "square wave multiplication unit U", any one of the output signals Su1-Su3 is referred to as an "output signal Su", and any one of the square waves W1-W3 is referred to as a "square wave W".

A square wave W, by which the input signal Si is multiplied in the square wave multiplication unit U, has a waveform whose amplitude in one of the half cycles is the same as that in the other of the half cycles, and whose polarity in the one of the half cycles is opposite to that in the other of the half cycles. The square wave W can be approximated as a sum of a fundamental wave and harmonic waves as illustrated in FIGS. 2A-2B and FIG. 3. The K-th harmonic wave has a frequency that is K times that of the fundamental wave and has an amplitude that is K-th of that of the fundamental wave.

The square wave multiplication unit U generates an output signal Su, which is proportional to the input signal Si, in each of one of the half cycles and the other of the half cycles in a cycle of the square wave W by which the input signal Si is multiplied, in such a way that an absolute value of a ratio between the input signal Si and the output signal Su in one of the half cycles is the same as that of a ratio between the input signal Si and the output signal Su in the other of the half cycles, and a sign (positiveness or negativeness) of the ratio in one of the half cycles is opposite to that in the other of the half cycles. In other words, in the square wave multiplication unit U, a ratio between the output signal Su and the input signal Si in one of the half cycles in a cycle of the square wave W is "A", and a ratio between the output signal Su and the input signal Si in the other of the half cycles in a cycle of the square wave W is "−A".

The square wave multiplication unit U1 (hereinafter, referred to as "first square wave multiplication unit U1") multiplies the input signal Si by the square wave W1 (hereinafter, referred to as "first square wave W1") that has, as a fundamental wave, a sine wave having frequency fs. In an example illustrated in FIG. 4, a frequency of the first square wave W1 is "fs", and an amplitude of the first square wave W1 is "A".

The square wave multiplication units U2, U3 (hereinafter, referred to as a "second square wave multiplication unit U2", a "second square wave multiplication unit U3") multiplies the input signal Si by square waves W2, W3 (hereinafter, referred to as a "second square wave W2", a "second square wave W3") that respectively have, as fundamental waves, sine waves having inverted phases with respect to harmonic waves included in the first square wave W1 having frequency fs. In other words, the second square wave multiplication unit U2 multiplies the input signal Si by the second square wave W2 that has, as a fundamental wave, a sine wave having an inverted phase with respect to the third harmonic wave in the first square wave W1. As illustrated in FIG. 4, a frequency of the second square wave W2 is "3fs" and an amplitude of the second square wave W2 is "A/3". Further, the second square wave multiplication unit U3 multiplies the input signal Si by the second square wave W3 that has, as a fundamental wave, a sine wave having an inverted phase with respect to the fifth harmonic wave in the first square wave W1. As illustrated in FIG. 4, a frequency of the second square wave W3 is "5fs" and an amplitude of the second square wave W3 is "A/5".

The signal synthesis unit 10 adds the output signal Su1 of the first square wave multiplication unit U1 and the output signals Su2, Su3 of the second square wave multiplication units U2, U3. By adding the output signals Su1-Su3, the signal synthesis unit 10 cancels a signal component, included in the output signal Su1, corresponding to a product of the third harmonic wave of the first square wave W1 and the input signal Si, by a signal component, included in the output signal Su2, corresponding to a product of the fundamental wave of the second square wave W2 and the input signal Si. Further, the signal synthesis unit 10 cancels a signal component, included in the output signal Su1, corresponding to a product of the fifth harmonic wave of the first square wave W1 and the input signal Si, by a signal component, included in the output signal Su3, corresponding to a product of the fundamental wave of the second square wave W3 and the input signal Si.

As described above, according to a sine wave multiplication device illustrated in FIG. 4, the signal component, included in the output signal Su1, corresponding to a product of the third harmonic wave of the first square wave W1 and the input signal Si, and the signal component corresponding to a product of the fifth harmonic wave of the first square wave W1 and the input signal Si, are canceled by the signal component, included in the output signal Su2, corresponding to a product of the fundamental wave of the second square wave W2 and the input signal Si, and the signal component, included in the output signal Su3, corresponding to a product of the fundamental wave of the second square wave W3 and the input signal Si. As a result, in an output signal So obtained as a synthesis result of the output signals Su1-Su3, signal components corresponding to the third harmonic wave and the fifth harmonic wave of the first square wave are decreased, and the signal component corresponding to a product of the fundamental wave of the first square wave W1 (sine wave having a frequency fs) and the input signal Si becomes a dominant component. Therefore, it is possible to generate an output signal So corresponding to a product of the sine wave having frequency fs and the input signal Si.

Further, according to an sine wave multiplication device illustrated in FIG. 4, in the square wave multiplication unit U, an output signal Su is generated in such a way that an absolute value of a ratio between the input signal and the output signal Su in one of the half cycles in a cycle of the square wave W by which the input signal Si is multiplied, is the same as that of the ratio in the other of the half cycles, and a sign of the ratio in one of the half cycles is opposite to that of the ratio in the other of the half cycles. In other words, multiplication of the input signal Si and the square wave W is performed by maintaining the absolute value of the ratio (signal gain) of the output signal Su with respect to the input signal Si, and by inverting the positive/negative sign at every half cycle of the square wave W. The square wave multiplication as described above is discrete signal processing in which a fixed signal gain is switched at every half cycle. As a result, the multiplication result is little affected by analog characteristics of currents and voltages of transistors. Therefore, unlike in a case of using an analog multiplier, it is possible for the multiplication to be affected little by the temperature characteristics and the input/output non-linear characteristics of transistors.

Second Embodiment

Next, as a second embodiment of the present invention, an example of a further detailed configuration of a sine wave multiplication device illustrated in FIG. 4 will be described.

Figure 5:
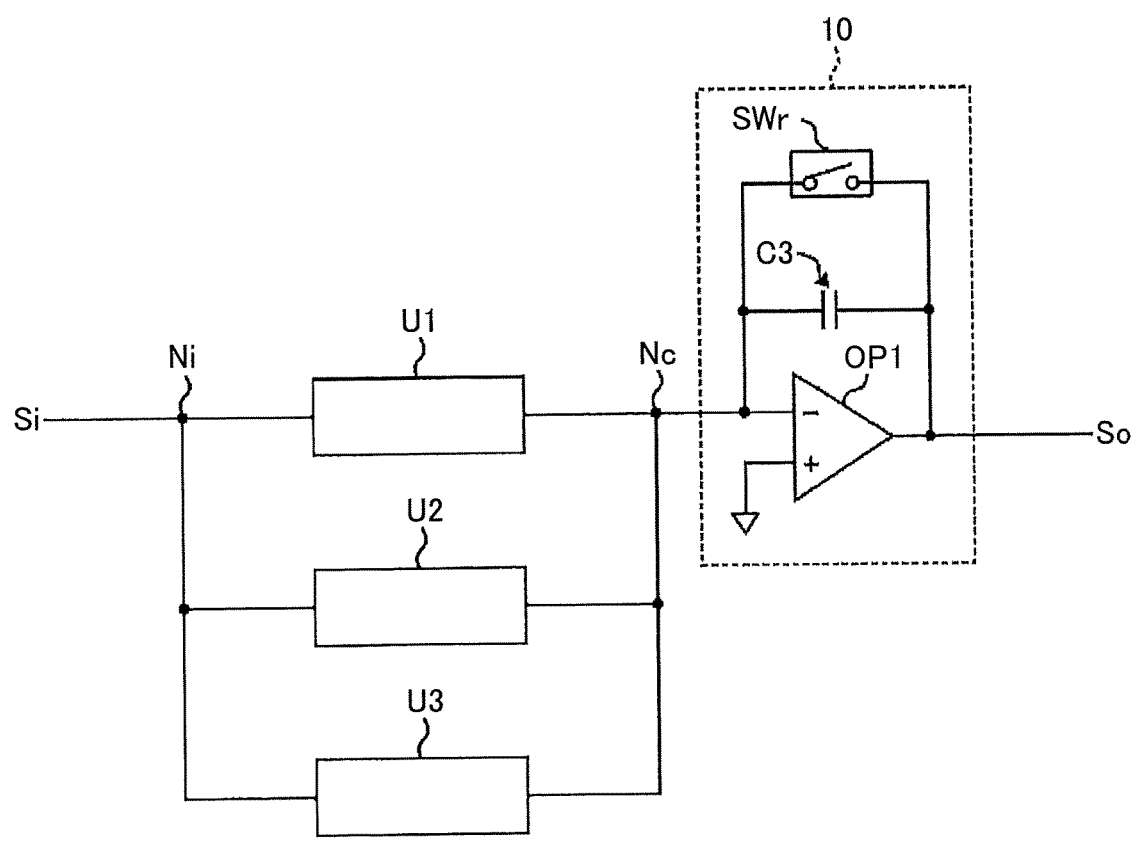
FIG. 5 is a drawing illustrating an example of a configuration of a sine wave multiplication device according to a second embodiment of the present invention.
Figure 6:
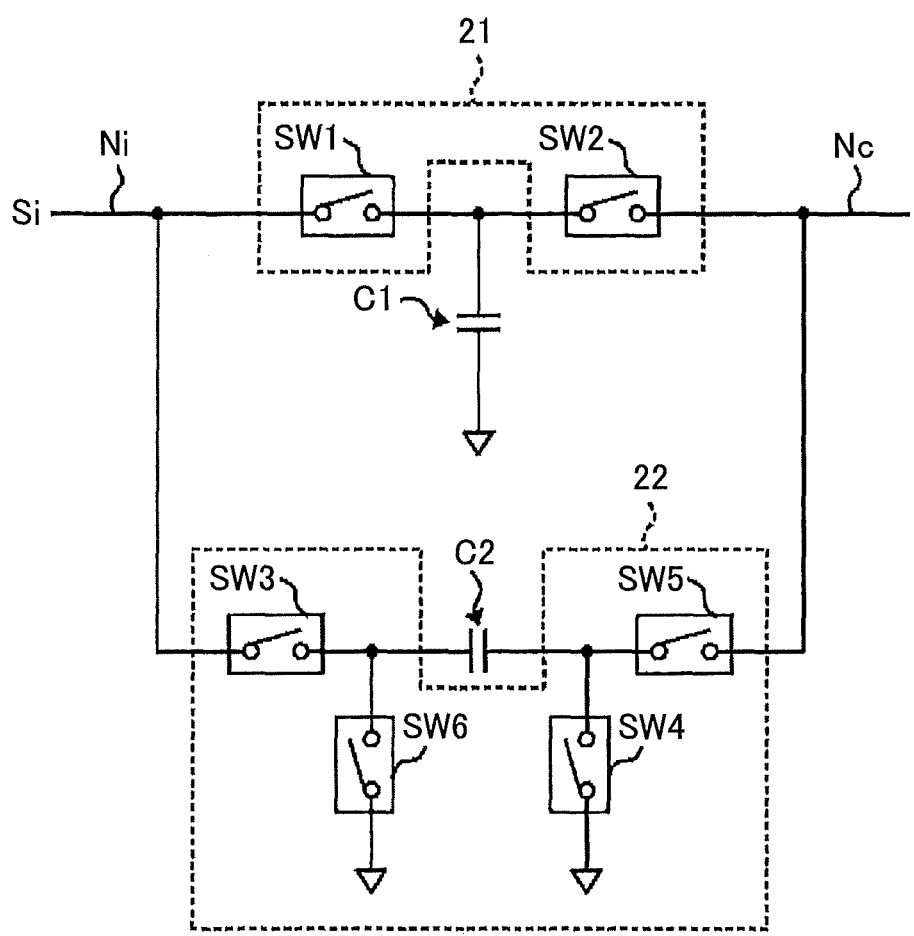
FIG. 6 is a drawing illustrating an example of a configuration of a square wave multiplication unit in the sine wave multiplication device according to the second embodiment.

FIG. 5 is a drawing illustrating an example of a configuration of a sine wave multiplication device according to a second embodiment of the present invention. FIG. 6 is a drawing illustrating an example of a configuration of square wave multiplication units U1-U3 (square wave multiplication unit U) in the sine wave multiplication device illustrated in FIG. 5.

Inputs of the square wave multiplication units U1-U3 are connected to an input node Ni to which the input signal Si is provided, and outputs of the square wave multiplication units U1-U3 are connected to a common output node Nc.

The square wave multiplication unit U according to the present embodiment outputs an electric charge as a result of multiplying the input signal Si by the square wave W. In other words, the square wave multiplication unit U repeats, alternately at a predetermined sampling cycle T, a charging operation, in which an electric charge proportional to a voltage of the input signal Si is accumulated, and an electric charge outputting operation, in which the electric charge accumulated in the charging operation is output to the signal synthesis unit 10, in each of one of the half cycles and the other of the half cycles in a cycle of the square wave by which the input signal Si is multiplied. Further, the square wave multiplication unit U performs the charging operation and the electric charge outputting operation in such a way that a ratio between the voltage of the input signal Si and an electric charge amount accumulated in the charging operation (voltage/electric charge amount) in one of the half cycles in a cycle of the square wave by which the input signal Si is multiplied, is the same as the ratio in the other of the half cycles, and that polarity of the electric charge output to the signal synthesis unit 10 in one of the half cycles is opposite to the polarity in the other of the half cycles.

The square wave multiplication unit U includes, as illustrated in, for example, FIG. 6, a first capacitor C1, a second capacitor C2, a first switch unit 21 that performs a charging operation and an electric charge outputting operation of the first capacitor C1, and a second switch unit 22 that performs a charging operation and an electric charge outputting operation of the second capacitor C2.

The first capacitor C1 is used for the charging operation and the electric charge outputting operation in one of the half cycles in a cycle of the square wave W by which the input signal Si is multiplied, and the second capacitor C2 is used for the charging operation and the electric charge outputting operation in the other of the half cycles in the cycle. The capacitor C1 and the capacitor C2 have a same capacitance.

Capacitances of the first capacitor C1 and the second capacitor C2 in the first square wave multiplication unit U1, the second square wave multiplication unit U2, and the third square wave multiplication unit U3 are set in such a way that the harmonic waves of the first square wave W1 have the same amplitudes as the fundamental waves of the second square waves W2, W3. When a capacitance of the first capacitor C1 and the second capacitor C2 in the first square wave multiplication unit U1 is referred to as "Cu1", a capacitance of the first capacitor C1 and the second capacitor C2 in the second square wave multiplication unit U2 is referred to as "Cu2", and a capacitance of the first capacitor C1 and the second capacitor C2 in the third square wave multiplication unit U3 is referred to as "Cu3", the capacitances Cu1-Cu3 are set as follows.

A ratio between the capacitance Cu1 and the capacitance Cu2 is set as shown in the following formula according to a ratio between an amplitude of the fundamental wave and an amplitude of the third harmonic wave, of the first square wave W1.

$$Cu1:Cu2=1:\tfrac{1}{3} \qquad (1)$$

By setting the ratio between the capacitances Cu1 and Cu2 according to Formula (1), an electric charge amount output from the first square wave multiplication unit U1 according to the third harmonic wave of the first square wave W1 becomes the same as an electric charge amount output from the second square wave multiplication unit U2 according to the fundamental wave of the second square wave W2. Because the third harmonic wave of the first square wave W1 has a phase opposite to the fundamental wave of the second square wave W2, an electric charge output from the first square wave multiplication unit U1 according to the third harmonic wave of the first square wave W1 is canceled by an electric charge output from the second square wave multiplication unit U2 according to the fundamental wave of the second square wave W2.

With respect to the above, a ratio between the capacitance Cu1 and the capacitance Cu3 is set as shown in the following formula according to a ratio between an amplitude of the fundamental wave and an amplitude of the fifth harmonic wave of the first square wave W1.

$$Cu1:Cu3=1:\tfrac{1}{5} \qquad (2)$$

By setting the ratio between the capacitances Cu1 and Cu3 according to Formula (2), an electric charge amount output from the first square wave multiplication unit U1 according to the fifth harmonic wave of the first square wave W1 becomes the same as an electric charge amount output from the second square wave multiplication unit U3 according to the fundamental wave of the second square wave W3. Because the fifth harmonic wave of the first square wave W1 has a phase opposite to the fundamental wave of the second square wave W3, an electric charge output from the first square wave multiplication unit U1 according to the fifth harmonic wave of the first square wave W1 is canceled by an electric charge output from the second square wave multiplication unit U3 according to the fundamental wave of the second square wave W3.

According to Formula (1) and Formula (2), ratios among the capacitances Cu1, Cu2, and Cu3 are represented by the following formula.

$$Cu1:Cu2:Cu3=1:\tfrac{1}{3}:\tfrac{1}{5}=15:5:3 \qquad (3)$$

The first switch unit 21 repeatedly performs the charging operation and the electric charge outputting operation of the first capacitor C1 in one of the half cycles in a cycle of the square wave W. In the one of the half cycles in which the first switch unit 21 operates, a charging operation and an electric charge outputting operation of the second capacitor C2 by the second switch unit 22 are stopped. In case of performing the charging operation of the first capacitor C1, the first switch unit 21 connects one end of the first capacitor C1 to the input node Ni and connects the other end of the first capacitor C1 to a reference potential. In case of performing the electric charge outputting operation of the first capacitor C1, the first switch unit 21 connects the one end of the first capacitor C1 to the output node Nc and connects the other end of the first capacitor C1 to the reference potential. The first switch unit 21 repeats, alternately at a sampling cycle T, the charging operation and the electric charge outputting operation.

The first switch unit 21 includes, as illustrated in, for example, FIG. 6, a first switch element SW1 and a second switch element SW2. The first switch element SW1 is provided on a current path between the input node Ni and the one end of the first capacitor C1. The second switch element SW2 is provided on a current path between the one end of the first capacitor C1 and the output node Nc. The other end of the first capacitor C1 is connected to the reference potential.

The second switch unit 22 repeatedly performs the charging operation and the electric charge outputting operation of the second capacitor C2 in the other of the half cycles in a cycle of the square wave W. In the other of the half cycles in which the second switch unit 22 operates, the charging operation and the electric charge outputting operation of the first capacitor C1 by the first switch unit 21 are stopped. In case of performing the charging operation of the second capacitor C2, the second switch unit 22 connects one end of the second capacitor C2 to the input node Ni and connects the other end of the second capacitor C2 to the reference potential. In case of performing the electric charge outputting operation of the second capacitor C2, the second switch unit 22 connects the other end of the second capacitor C2 to the output node Nc and connects the one end of the second capacitor C1 to the reference potential. The second switch unit 22 alternately repeats, alternately at a sampling cycle T, the charging operation and the electric charge outputting operation.

The second switch unit 22 includes, as illustrated in, for example, FIG. 6, a third switch element SW3, a fourth switch element SW4, a fifth switch element SW5, and a sixth switch element SW6. The third switch element SW3 is provided on a current path between the input node Ni and the one end of the second capacitor C2. The fourth switch element SW4 is provided on a current path between the one other end of the second capacitor C2 and the reference potential. The fifth switch element SW5 is provided on a current path between the other end of the second capacitor C2 and the output node Nc. The sixth switch element SW6 is provided on a current path between the one end of the second capacitor C2 and the reference potential.

The switch elements of the first switch unit 21 and the second switch unit 22 respectively operate as follows. In the one of the half cycles of the square wave in which the first switch unit 21 operates, the first switch element SW1 and the second switch element SW2 are alternately turned ON. In other words, in case of performing the charging operation of the first capacitor C1, the first switch element SW1 is turned ON and other switch elements are turned OFF. In case of performing the electric charge outputting operation of the first capacitor C1, the second switch element SW2 is turned ON and other switch elements are turned OFF. In the other of the half cycles of the square wave in which the second switch unit 22 operates, a pair of the third switch element SW3 and the fourth switch element SW4 and a pair of the fifth switch element SW5 and the sixth switch element SW6 are alternately turned ON. In other words, in case of performing the charging operation of the second capacitor C2, the third switch element SW3 and the fourth switch element SW4 are turned ON and other switch elements are turned OFF. In case of performing the electric charge outputting operation of the second capacitor C2, the fifth switch element SW5 and the sixth switch element SW6 are turned ON and other switch elements are turned OFF.

In the case where the same input signal Si is provided, the polarity of the electric charge output to the signal synthesis unit 10 in the charging operation and the electric charge outputting operation of the first switch unit 21, is opposite to the polarity of electric charge output to the signal synthesis unit 10 in the charging operation and the electric charge outputting operation of the second switch unit 22. In other words, in the case where the input signal Si has a positive voltage with respect to a reference potential, a positive electric charge is output to the signal synthesis unit 10 according to the charging operation and the electric charge outputting operation of the first switch unit 21, and a negative electric charge is output to the signal synthesis unit 10 according to the charging operation and the electric charge outputting operation of the second switch unit 22. In the following, an operation mode, in which a positive electric charge is output to the signal synthesis unit 10 in the case where the input signal Si has a positive voltage with respect to a reference potential, is referred to as a "non-inverting mode", and an operation mode, in which a negative electric charge is output to the signal synthesis unit 10, is referred to as an "inverting mode".

Every time when a predetermined number of electric charge outputting operations are performed, the signal synthesis unit 10 generates an output signal So corresponding to a sum of electric charges output from the square wave multiplication units (U1-U3) according to the electric charge outputting operations.

In an example of FIG. 5, the signal synthesis unit 10 includes a third capacitor C3, an amplifier circuit OP1, and a discharge circuit SWr.

One of the terminals of the third capacitor C3 is connected to the output node Nc, and the other terminal is connected to an output of the amplifier circuit OP1.

The amplifier circuit OP1 controls a voltage of the other terminal of the third capacitor C3 in such a way that a voltage difference between the output node Nc and the reference potential is caused to be zero. The amplifier circuit OP1 is, for example, an operational amplifier, an inverting input terminal of which is connected to the output node Nc and a non-inverting input terminal of which is connected to a reference potential. In this case, the output node Nc connected to the inverting input terminal of the amplifier circuit OP1 is substantially the same as the reference potential The discharge circuit SWr discharges an electric charge accumulated in the third capacitor C3 every time when a predetermined number of electric charge outputting operations are performed by the square wave multiplication units (U1-U3). The discharge circuit SWr is composed of, for example, a switch element connected in parallel with the third capacitor C3 as illustrated in FIG. 5.

According to the above-described configuration, when one of the terminals of the capacitors (C1, C2) is connected to the output node Nc according to the electric charge outputting operation of the square wave multiplication units (U1-U3), the other of the terminals of the capacitors (C1, C2) is connected to a reference potential and the output node Nc is maintained to be a reference potential according to the amplifier circuit OP1, and thus, an electric charge accumulated in the capacitors (C1, C2) of the square wave multiplication units (U1-U3) is transferred to the third capacitor C3. Therefore, a voltage of the output signal So of the amplifier circuit OP1 is caused to be a voltage corresponding to a sum of electric charges transferred from the capacitors (C1, C2) of the square wave multiplication units (U1-U3).

Figure 7:
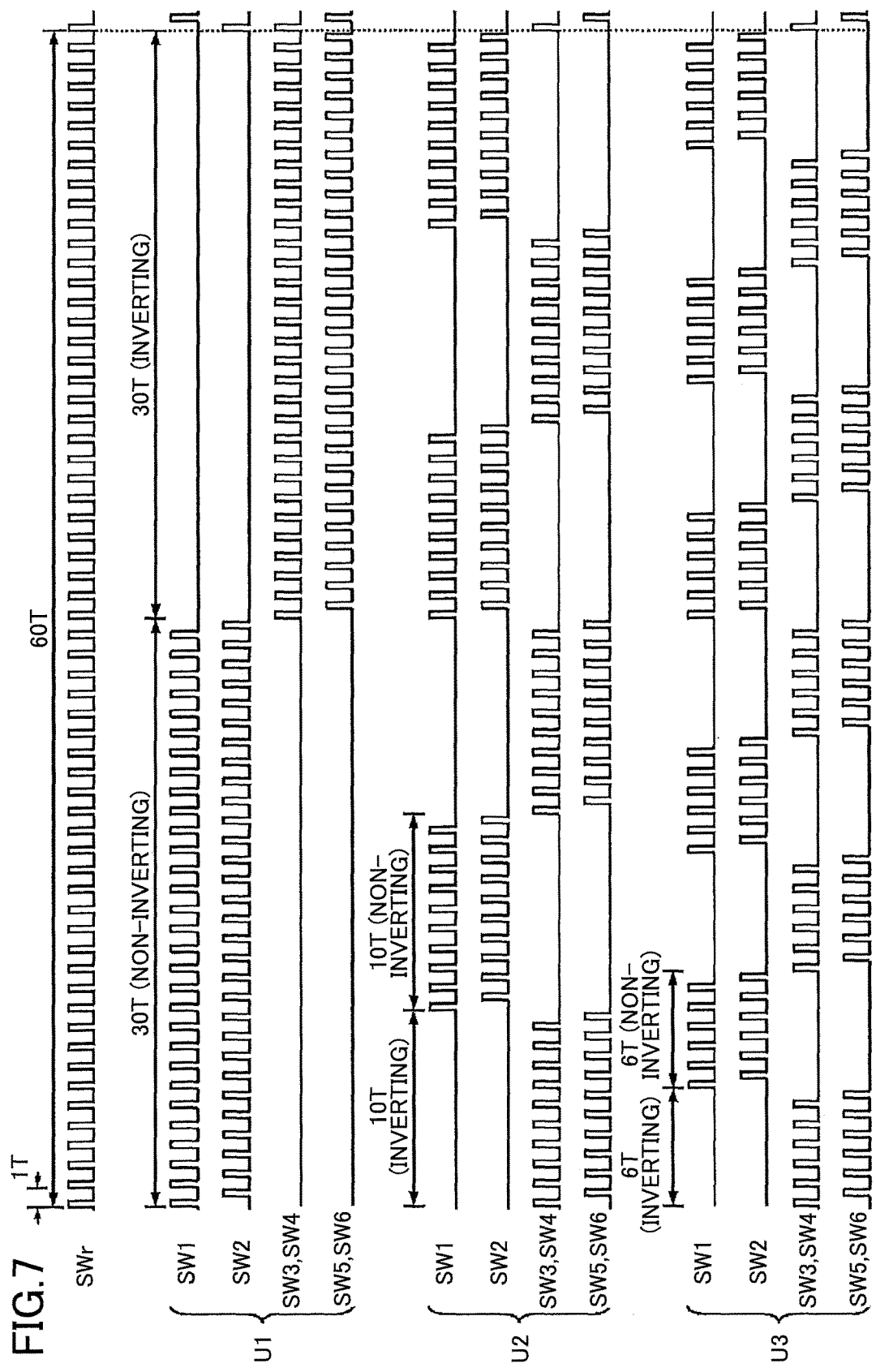
FIG. 7 is a timing chart illustrating ON/OFF states of switch elements of the square wave multiplication unit and a signal synthesis unit in the sine wave multiplication device according to the second embodiment.

FIG. 7 is a timing chart illustrating ON/OFF states of switch elements of the square wave multiplication units (U1-U3) and the signal synthesis unit 10 in the sine wave multiplication device according to the second embodiment. In the timing chart of FIG. 7, a high level indicates an ON state of a switch element and a low level indicates an OFF state of a switch element.

The first switch element SW1 and the second switch element SW2, which are alternately turned ON, are controlled in such a way that the ON states of the switch elements SW1 and SW2 do not overlap each other in order to avoid a cross talk due to delayed ON/OFF operations.

The pair of the third switch element SW3 and the fourth switch element SW4 and the pair of the fifth switch element SW5 and the sixth switch element SW6, which are alternately turned ON, are controlled in the same way.

In an example of FIG. 7, a cycle of the first square wave W1 (1/fs) is set to 60 cycles of the sampling cycle T (60T), a cycle of the second square wave W2 (⅓fs) is set to 20 cycles of the sampling cycle T (20T), and a cycle of the second square wave W3 (⅕fs) is set to 12 cycles of the sampling cycle T (12T).

The number of cycles (30 cycles in an example of FIG. 7), which defines a half cycle of the first square wave W1, of the sampling cycle T is set to a common multiple of the magnitudes (3 times, 5 times) of the frequencies (3fs, 5fs) of the harmonic waves, which should be canceled by outputs of the second square wave multiplication units (U2, U3), with respect to the fundamental wave frequency fs. In an example of FIG. 5, because the third harmonic wave and the fifth harmonic wave of the first square wave W1 should be canceled, "30", which is a common multiple of "3" and "5", is set as the number of cycles of the sampling cycle T in a half cycle of the first square wave W1. By setting the number of cycles of the sampling cycle T in a half cycle of the first square wave W1 as described above, the numbers of cycles of the sampling cycle T in a half cycle of the second square waves (W2, W3) can be caused to be integer values, and thus, ratios between the cycle of the first square wave W1 and the cycles of the second square waves W2, W3 can be accurately set by the number of cycles of the sampling cycle T.

In the first square wave multiplication unit U1, a non-inverting mode operation is performed thirty (30) times by the first switch unit 21 in a first half cycle (30T) of the first square wave W1, and an inverting mode operation is performed thirty (30) times by, the second switch unit 22 in a second half cycle (30T) of the first square wave W1.

In the second square wave multiplication unit U2, an inverting mode operation is performed ten (10) times by the second switch unit 22 in a first half cycle (10T) of the second square wave W2, and a non-inverting mode operation is performed ten (10) times by the first switch unit 21 in a second half cycle (10T) of the second square wave W2. When a non-inverting mode operation is started in the first square wave multiplication unit U1, an inverting mode operation in the second square wave multiplication unit U2 is started, and thus, the fundamental wave of the second square wave W2 has a phase opposite to the third harmonic wave of the first square wave W1.

In the second square wave multiplication unit U3, an inverting mode operation is performed six (6) times by the second switch unit 22 in a first half cycle (6T) of the second square wave W3, and a non-inverting mode operation is performed six (6) times by the first switch unit 21 in a second half cycle (6T) of the second square wave W3. When a non-inverting mode operation is started in the first square wave multiplication unit U1, an inverting mode operation in the second square wave multiplication unit U3 is started, and thus, the fundamental wave of the second square wave W3 has a phase opposite to the fifth harmonic wave of the first square wave W1.

In the signal synthesis unit 10, in every cycle of the sampling cycle T, in which the charging operation is performed in the square wave multiplication units U1-U3, the discharge circuit SWr is turned ON and an electric charge of the third capacitor C3 is discharged. A latter stage circuit (not shown), which processes the output signal So of the signal synthesis unit 10, performs sampling of the output signal So in a period when the discharge circuit SWr is turned OFF, and performs processing of the sample-held analog signal such as low-pass filtering and analog-to-digital conversion.

It should be noted that, in an example of FIG. 7, the electric charge of the third capacitor C3 is discharged at every cycle of the sampling cycle T. However, in the case where the electric charge amount is very small, the discharge circuit SWr may be turned ON at every once in multiple cycles of the sampling cycle T. In this case, the latter stage circuit, which processes the output signal So, performs sampling of the output signal So just before the discharge circuit SWr is turned ON. With the above arrangement, the electric charge amount accumulated in the third capacitor C3 is increased, and thus, the level of the output signal So can be increased.

As described above, according to a sine wave multiplication device according to an embodiment of the present invention, the multiplication of the input signal Si by the square wave W is performed by repeating the charging operations and the electric charge outputting operations of the capacitors (C1, C2) in the square wave multiplication unit U at the sampling cycle T, and by inverting the polarity of the outputting electric charge of the electric charge outputting operation at every half cycle of the square wave W. Therefore, it is possible to accurately set the cycle and the phase of the square wave in the square wave multiplication unit U according to the number of cycles of the sampling cycle T. Further, a capacitance ratio between the capacitors in the square wave multiplication unit U tends not to be affected by the variations due to the temperature or manufacturing processes, and thus, an amplitude ratio between the square waves W, by which the input signal Si is multiplied in the square wave multiplication units U, can be set accurately. Therefore, signal components (electric charges), included in an output of the first square wave multiplication unit U1, corresponding to products of the harmonic waves of the first square wave W1 and the input signal Si, can be accurately canceled by signal components (electric charges), included in the outputs of the second square wave multiplication units U2, U3, corresponding to products of the fundamental waves of the second square waves W2, W3 and the input signal Si.

Third Embodiment

Next, a third embodiment of the present invention will be described. In a sine wave multiplication device according to the third embodiment, the square wave multiplication units U1-U3 in a sine wave multiplication device according to the second embodiment are replaced by square wave multiplication units UA1-UA3 illustrated in FIG. 8. The remaining configuration is the same as that of a sine wave multiplication device according to the second embodiment.

The square wave multiplication units UA1-UA3 include a first capacitor C1, a second capacitor C2, a fourth capacitor C4, a first switch unit 21A, and a second switch unit 22. The second switch unit 22 and the second capacitor C2 are the same as the elements with the same reference numerals in FIG. 6, and thus, the descriptions will be omitted.

The first switch unit 21A includes, in addition to the switch elements similar to the first switch unit 21 (SW1, SW2), a seventh switch element SW7, an eighth switch element SW8, and a ninth switch element SW9. The fourth capacitor C4 is provided in a current path between the first switch element SW1 and the input node Ni. The seventh switch element SW7 is provided in a current path between an end of the fourth capacitor C4 and the input node Ni. The eighth switch element SW8 is provided in a current path between the end of the fourth capacitor C4 and a reference potential. The ninth switch element SW9 is provided in a current path between the other end of the fourth capacitor C4 and the reference potential.

Figure 9:
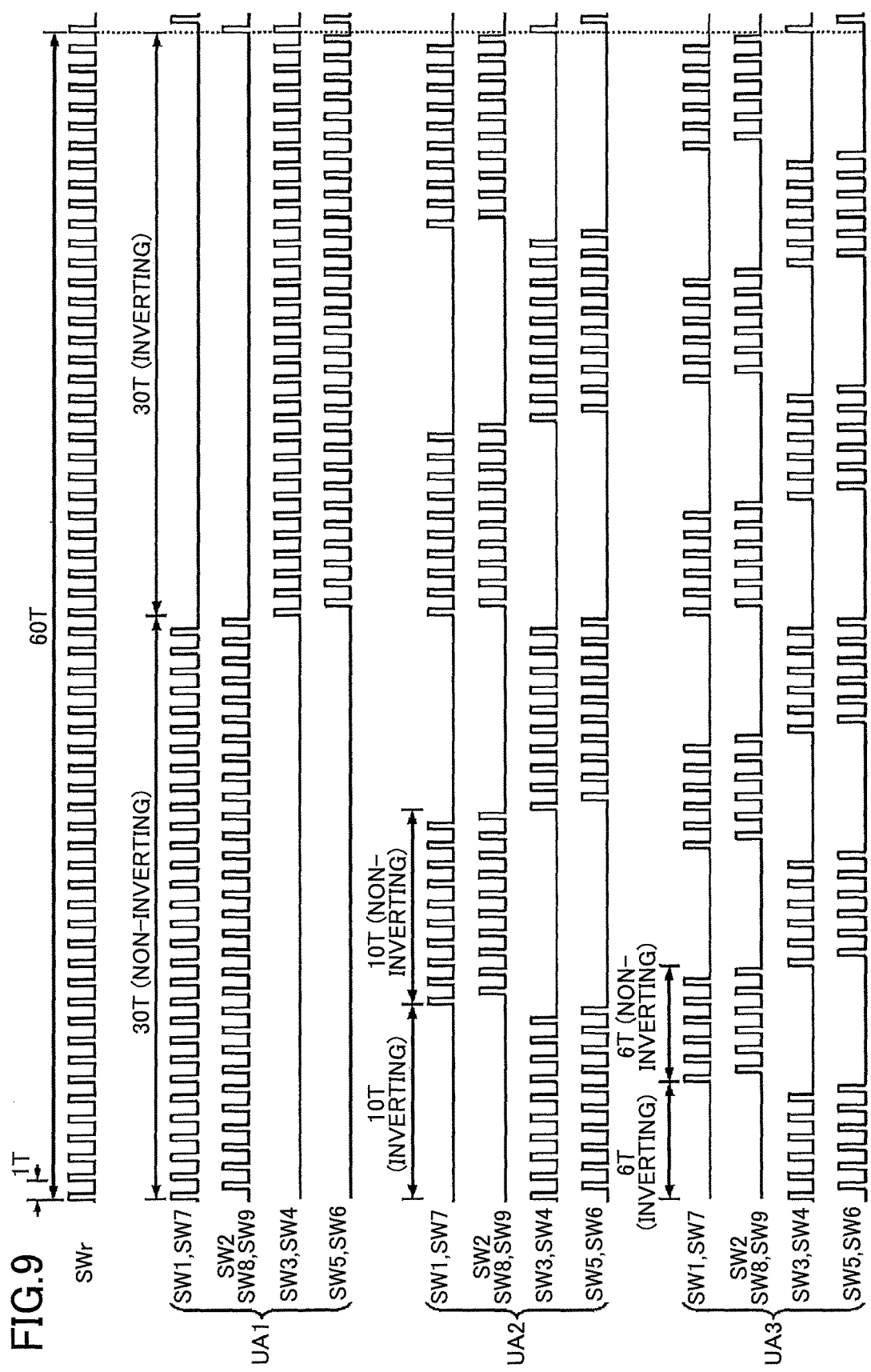
FIG. 9 is a timing chart illustrating ON/OFF states of switch elements of the square wave multiplication unit and a signal synthesis unit in the sine wave multiplication device according to the third embodiment.

FIG. 9 is a timing chart illustrating ON/OFF states of switch elements of the square wave multiplication units (UA1-UA3) and the signal synthesis unit 10 in the sine wave multiplication device according to the third embodiment. As illustrated in FIG. 9, the seventh switch element SW7 is turned ON/OFF under the same condition as the first switch element SW1. Further, the eighth switch element SW8 and the ninth switch element SW9 are turned ON/OFF under the same condition as the second switch element SW2. Operations of other switch elements are the same as those of the timing chart illustrated in FIG. 7.

The two switch elements (SW1, SW2) connected to a terminal, which is not connected to the reference potential, of the first capacitor C1 may provide an unnecessary electric charge to the first capacitor C1 due to the charge and discharge of a parasitic capacitance, and the accuracy of the multiplication processing may be decreased due to an error caused by the unnecessary electric charge. Therefore, in the square wave multiplication units UA1-UA3 illustrated in FIG. 8, a serial circuit of the first capacitor C1 and the fourth capacitor C4 is charged by the input signal Si at the time of charging operation, and, at the time of electric charge outputting operation, an electric charge of the first capacitor C1 is output to the signal synthesis unit 10 and an electric charge of the fourth capacitor C4 is discharged by connecting the both ends of the fourth capacitor C4 to the reference potential. With the above operations, the unnecessary electric charge provided to the first capacitor C1 due to the charge and discharge of the parasitic capacitance of the switch elements (SW1, SW2, SW9) can be canceled.

Figure 8:
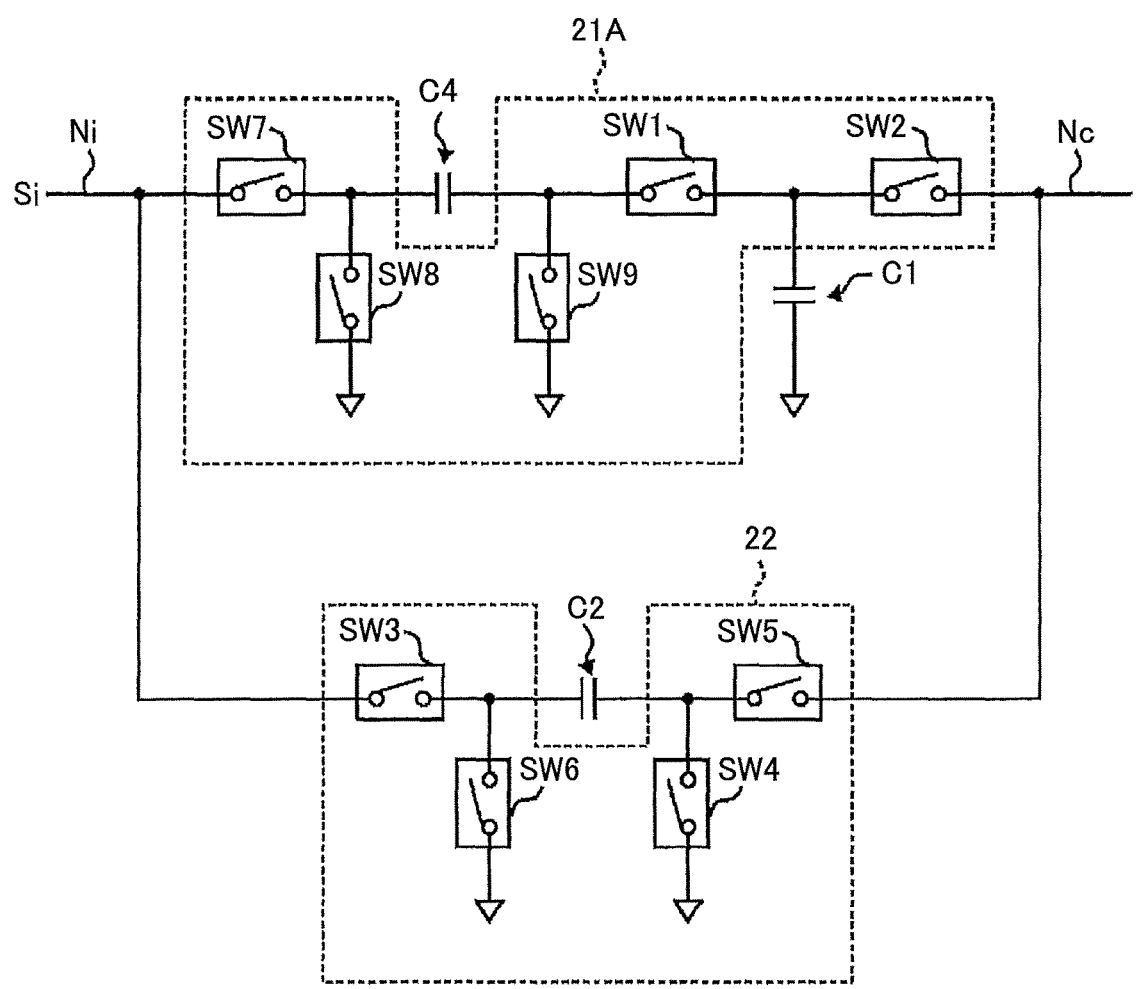
FIG. 8 is a drawing illustrating an example of a configuration of a square wave multiplication unit in a sine wave multiplication device according to a third embodiment of the present invention.

It should be noted that, in the square wave multiplication units UA1-UA3 illustrated in FIG. 8, an electric charge is charged by the serial circuit of the first capacitor C1 and the fourth capacitor C4 at the time of charging operation. Therefore, capacitances of the first capacitor C1 and the fourth capacitor C4 are set in such a way that the capacitance of the serial circuit of the first capacitor C1 and the fourth capacitor C4 is caused to be the same as the capacitance of the second capacitor C2. For example, the capacitances of the first capacitor C1 and the fourth capacitor C4 are set to doubles of the capacitance of the second capacitor C2.

Fourth Embodiment

Figure 10:
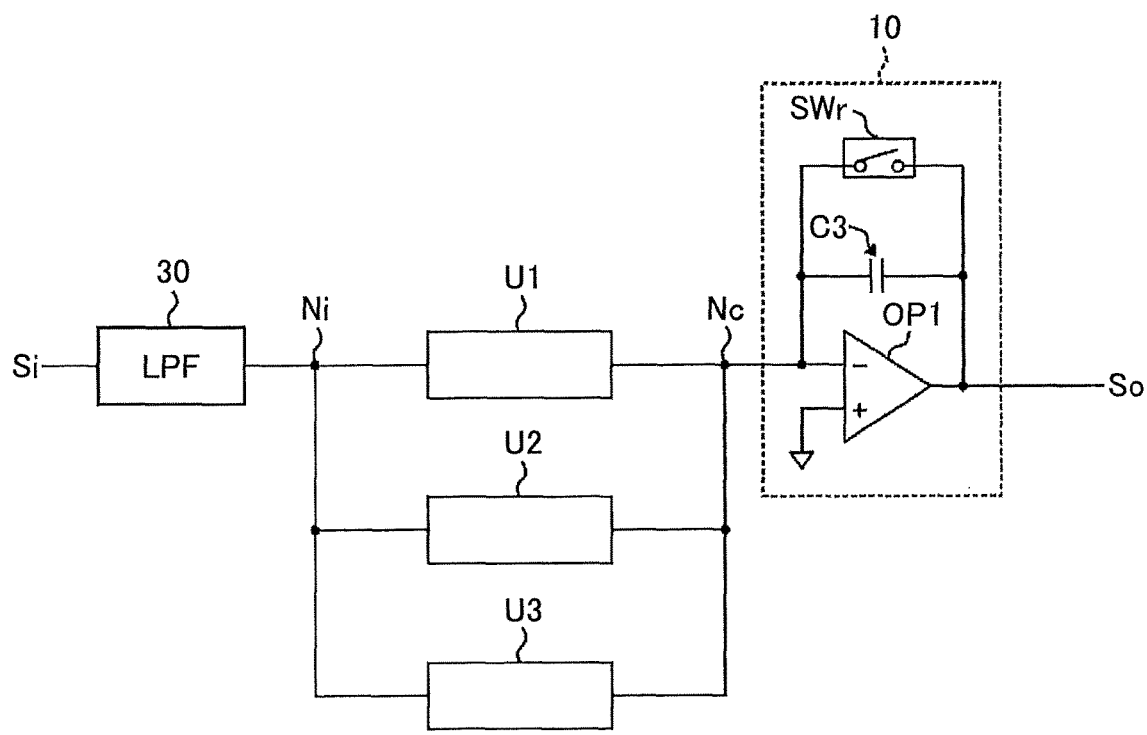
FIG. 10 is a drawing illustrating an example of a configuration of a sine wave multiplication device according to a fourth embodiment of the present invention.

Next, a fourth embodiment of the present invention will be described. FIG. 10 is a drawing illustrating an example of a configuration of a sine wave multiplication device according to a fourth embodiment of the present invention. In the sine wave multiplication device illustrated in FIG. 10, a first low-pass filter 30 is provided to a sine wave multiplication device according to the second and third embodiments (FIG. 5). The remaining configuration is the same as that of a sine wave multiplication device according to the second and third embodiments.

In a sine wave multiplication device according to the second and third embodiments, the input signal Si is discretely processed in the square wave multiplication units (U1-U3, UA1-UA3), and thus, aliasing noise may be generated in the outputs of the square wave multiplication units. The first low-pass filter 30 is used for decreasing the aliasing noise, and attenuates high frequency components of the input signal Si input to the square wave multiplication units. In other words, the first low-pass filter 30 attenuates noise components, included in the input signal Si, which may generate aliasing noise in the signal band of the input signal Si from the frequencies that are integer multiples of the sampling frequency (1/T). According to the above, even in the case where the input signal Si includes relatively high frequency noise, aliasing noise in the signal band of the input signal Si is still prevented and the multiplication processing can be performed accurately.

Further, although components derived from the third harmonic wave and the fifth harmonic wave of the first square wave W1 (harmonic waves*input signal Si) can be canceled by synthesizing the outputs of the square wave multiplication units (U1-U3, UA1-UA3), there exist other harmonic waves, which are not canceled, in the first square wave. As a result, there remains components derived from those harmonic waves in the output signal So. In particular, the seventh harmonic wave, whose amplitude is greatest next to the fifth harmonic wave, may affect the accuracy of the multiplication result. Further, as illustrated in FIG. 3, not only the fundamental waves of the second square waves W2, W3 but also the harmonic waves of the second square waves W2, W3 (FIG. 3 (B), FIG. 3 (C)) are the same as a part of the harmonic waves of the first square wave W1 (FIG. 3 (A)). In an example of FIG. 3, the third harmonic wave and the fifth harmonic wave of the second square wave W2 are the same as the ninth harmonic wave and the fifteenth harmonic wave of the first square wave W1. Further, the third harmonic wave of the second square wave W3 is the same as the fifteenth harmonic wave of the first square wave W1. Therefore, the fifteenth harmonic wave of the first square wave W1 is subtracted not only by the second square wave W2 but also by the second square wave W3, and thus, an error is generated.

Therefore, the first low-pass filter 30 attenuates high frequency components of the input signal Si before inputting the input signal Si to the square wave multiplication units (111-U3, UA1-UA3). Because the lowest harmonic wave that may affect the accuracy is the seventh harmonic wave (frequency 7fs) of the first square wave W1, the frequency characteristics of the first low-pass filter 30 is set in such a way that components of frequencies higher than the frequency 7fs are attenuated to the extent that the multiplication accuracy is not affected.

Figure 11:
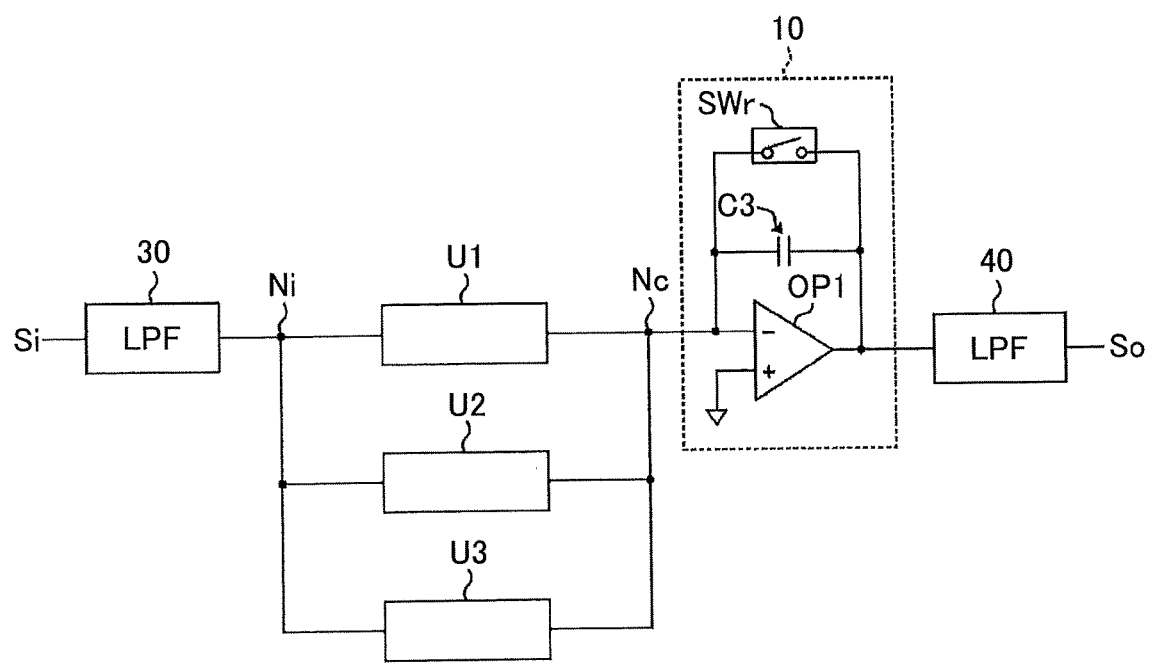
FIG. 11 is a drawing illustrating an example of another configuration of a sine wave multiplication device according to the fourth embodiment.

FIG. 11 is a drawing illustrating an example of another configuration of a sine wave multiplication device according to the fourth embodiment. In the sine wave multiplication device illustrated in FIG. 11, a second low-pass filter 40 is added to the sine wave multiplication device illustrated in FIG. 10. The remaining configuration is the same as that of the sine wave multiplication device illustrated in FIG. 10.

The sine wave multiplication device illustrated in FIG. 11 can operate as a circuit (narrow-band bandpass filter circuit) that extracts only a signal component that has frequency fs included in the input signal Si. In this case, by extracting a direct current component of the output signal So according to the second low-pass filter 40, a level of the direct current is caused to be a level corresponding to an amplitude of a signal component of frequency fs included in the input signal Si. The second low-pass filter 40 is composed of, for example, a digital filter that discretely processes a result of AD conversion of the output signal So.

Fifth Embodiment

Figure 12:
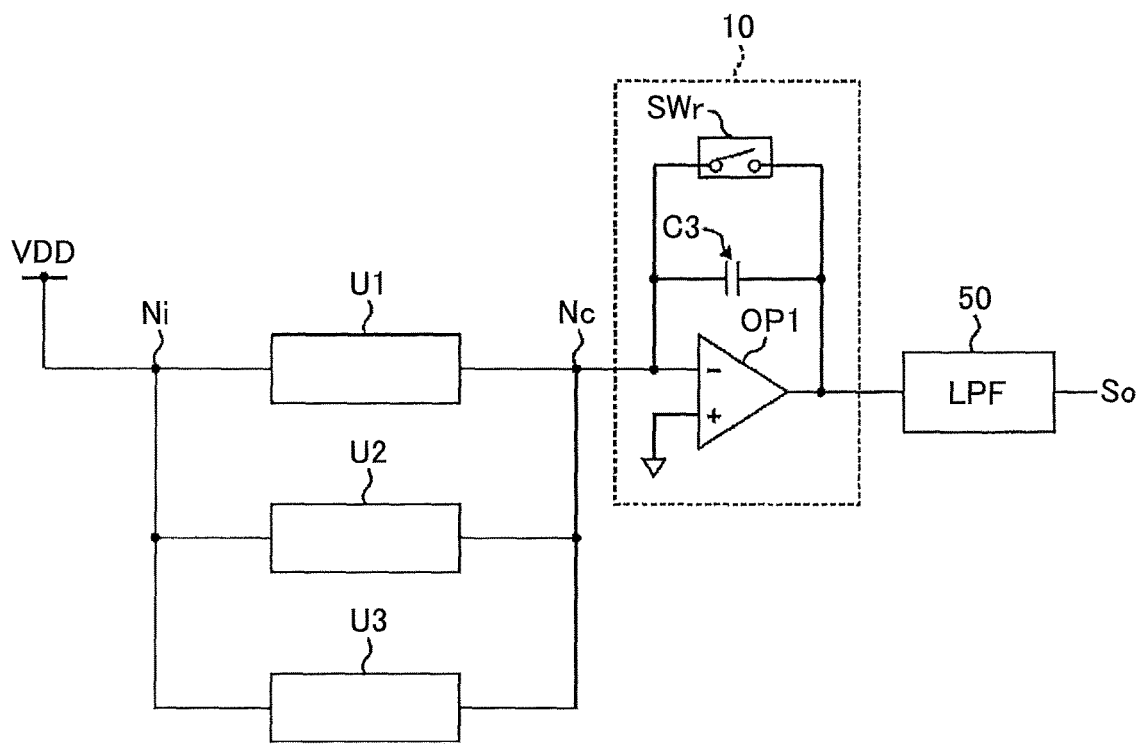
FIG. 12 is a drawing illustrating an example of a configuration of a sine wave multiplication device according to a fifth embodiment of the present invention.

Next, a fifth embodiment of the present invention will be described. FIG. 12 is a drawing illustrating an example of a configuration of a sine wave multiplication device according to a fifth embodiment of the present invention. In the sine wave multiplication device illustrated in FIG. 12, a low-pass filter 50 is provided to the sine wave multiplication device according to the second and third embodiments (FIG. 5) and the input signal Si is caused to be a DC voltage VDD. The remaining configuration is the same as that of the sine wave multiplication device according to the second and third embodiments.

In the sine wave multiplication device illustrated in FIG. 12, the input signal Si is a DC voltage VDD, and thus, the output signal So is caused to be a signal, in which the DC voltage is multiplied by a sine wave, i.e., a sine wave. The sine wave multiplication device illustrated in FIG. 10 converts a signal component of frequency fs to a DC component. On the other hand, the sine wave multiplication device illustrated in FIG. 12 generates a signal of frequency fs from a DC component, and thus, the input/output relationships are reversed. Therefore, similar to the sine wave multiplication device illustrated in FIG. 10, the low-pass filter 50 attenuates components of frequencies that are higher than the seventh harmonic wave component (frequency 7fs). As described above, a sine wave multiplication device according to an embodiment can also operate as an accurate sine wave generation circuit.

Sixth Embodiment

Figure 13:
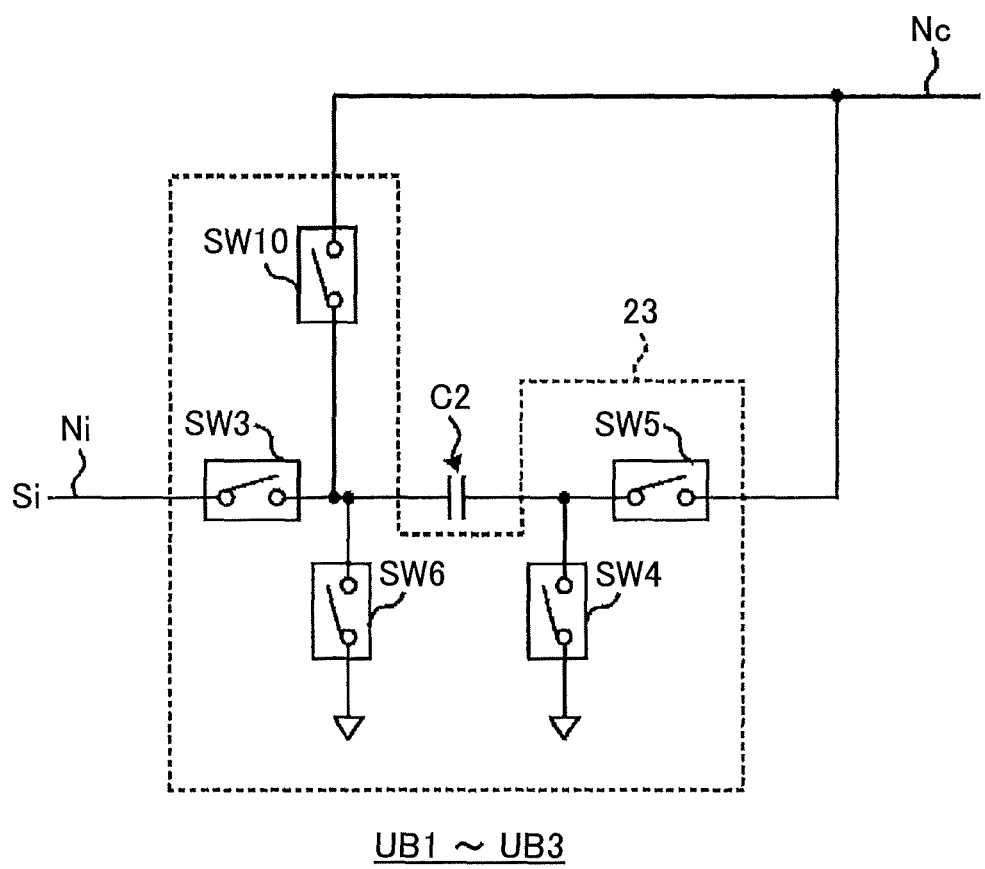
FIG. 13 is a drawing illustrating an example of a configuration of a square wave multiplication unit in a sine wave multiplication device according to a sixth embodiment of the present invention.

Next, a sixth embodiment of the present invention will be described. FIG. 13 is a drawing illustrating an example of a configuration of square wave multiplication units UB1-UB3 in a sine wave multiplication device according to the sixth embodiment. In a sine wave multiplication device according to the sixth embodiment, the square wave multiplication units U1-U3 in a sine wave multiplication device according to the second embodiment are replaced by square wave multiplication units UB1-UB3 illustrated in FIG. 13. The remaining configuration is the same as that of a sine wave multiplication device according to the second embodiment.

In the square wave multiplication units illustrated in FIG. 6 and FIG. 8, two capacitors (C1, C2) are independently provided for the non-inverting mode and for the inverting mode, respectively. On the other hand, in the sine wave multiplication units UB1-UB3 illustrated in FIG. 13, a common capacitor C2 is used for the non-inverting mode and the inverting mode.

In an example of FIG. 13, the square wave multiplication units UB1-UB3 include a third switch unit 23 and a second capacitor C2. The third switch unit 23 includes, in addition to the switch elements (SW3, SW4, SW5, SW6) as included in the second switch 22, a tenth switch element SW10. The connection relationships between the second capacitor C2 and the switch elements (SW3, SW4, SW5, SW6) are the same as in FIG. 6 and FIG. 8. The tenth switch element SW10 is provided on a current path between an end of the second capacitor C2, to which the third switch element SW3 and the sixth switch element SW6 are connected, and the output node Nc.

Figure 14:
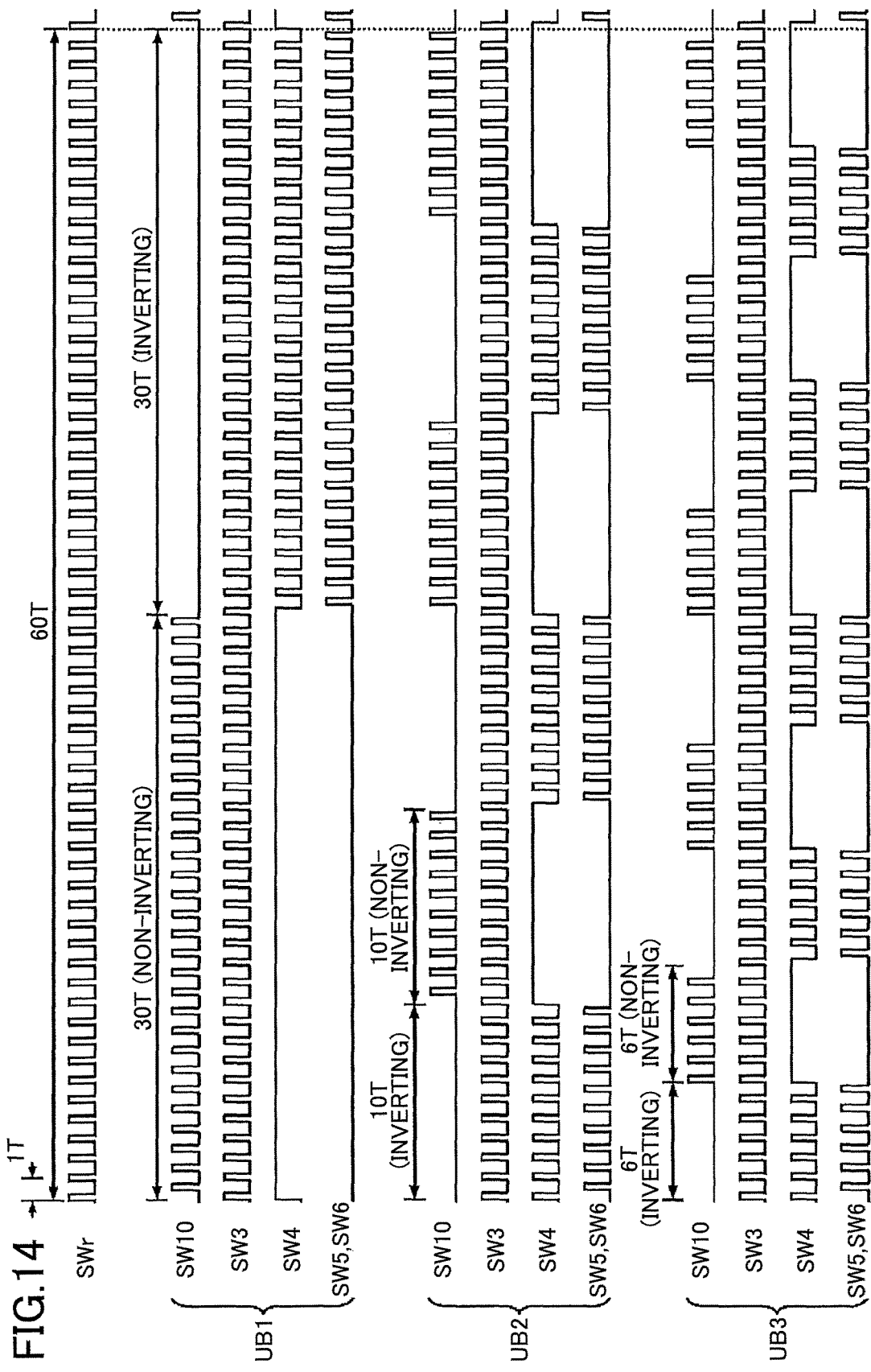
FIG. 14 is a timing chart illustrating ON/OFF states of switch elements of the square wave multiplication unit and a signal synthesis unit in the sine wave multiplication device according to the sixth embodiment.

FIG. 14 is a timing chart illustrating ON/OFF states of switch elements of the square wave multiplication units UB1-UB3 and the signal synthesis unit 10 in the sine wave multiplication device according to the sixth embodiment. In the non-inverting mode, the fourth switch element SW4 is always in an ON state. In the charging operation of the non-inverting mode, the third switch element SW3 is turned ON and other switch elements except for the fourth switch element SW4 are turned OFF. In the electric charge outputting operation of the non-inverting mode, the tenth switch element SW10 is turned ON and other switch elements except for the fourth switch element SW4 are turned OFF. With respect to the above, in the inverting mode, the tenth switch element SW10 is always in an OFF state. In the charging operation of the inverting mode, a pair of the third switch element SW3 and the fourth switch element SW4 are turned ON and other switch elements are turned OFF. In the electric charge outputting operation of the inverting mode, the fifth switch element SW5 and the sixth switch element SW6 are turned ON and other switch elements are turned OFF. This operation is the same as the second switch unit 22 in FIG. 6 and FIG. 8.

As described above, according to an embodiment of the present invention, a single capacitor C2 is used for both the non-inverting mode and the inverting mode, and thus, the circuit configuration can be simpler.

Seventh Embodiment

Figure 15:
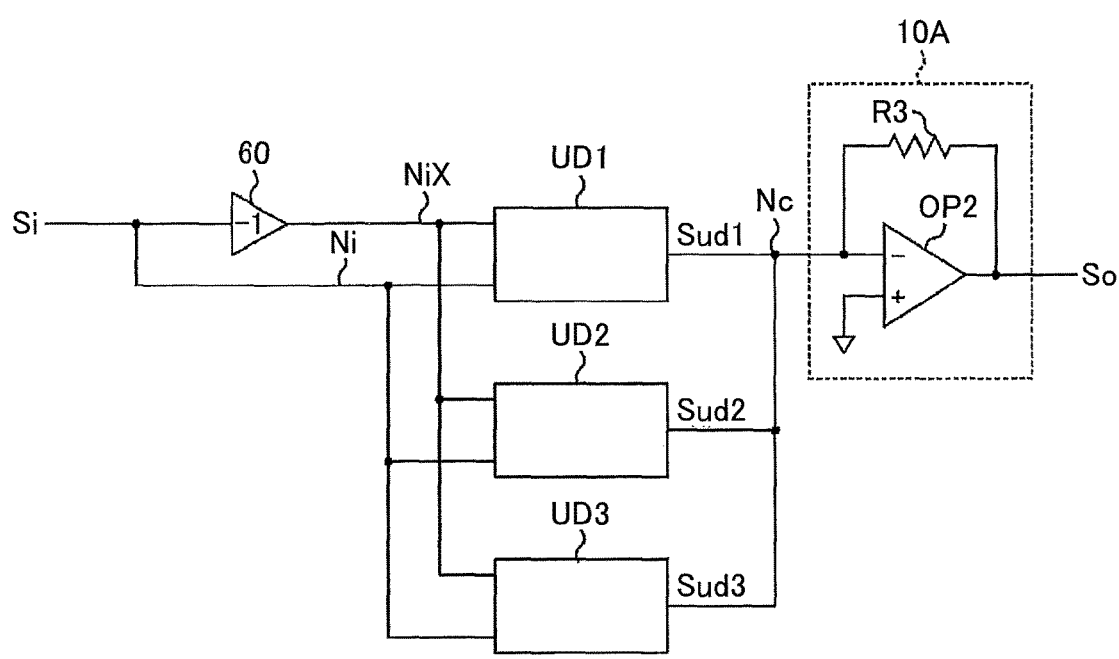
FIG. 15 is a drawing illustrating an example of a configuration of a sine wave multiplication device according to a seventh embodiment of the present invention.

Next, a seventh embodiment of the present invention will be described. FIG. 15 is a drawing illustrating an example of a configuration of a sine wave multiplication device according to the seventh embodiment. The sine wave multiplication device illustrated in FIG. 15 includes an inverting amplifier circuit 60, square wave multiplication units UD1-UD3, and a signal synthesis unit 10A.

The inverting amplifier circuit 60 is a circuit for inverting the polarity of the input signal Si with respect to the reference potential, and inputs, as an inverted input signal −Si, a result of multiplying the input signal Si by a gain "−1", to the square wave multiplication units UD1-UD3.

The input signal Si and the inverted input signal −Si are input to the square wave multiplication units UD1-UD3.

In one of the half cycles of a cycle of the square waves W1-W3 by which the input signal Si is multiplied, the square wave multiplication units UD1-UD3 generate output signals Sud1-Sud3 that are proportional to the input signal Si by a predetermined factor, and, in the other one of the half cycles of the cycle, generate the output signals Sud1-Sud3 that are proportional to the inverted input signal −Si by the predetermined factor. In the following, any one of the square wave multiplication units UD1-UD3 is referred to as a "square wave multiplication unit UD", any one of the output signals Sud1-Sud3 is referred to as an "output signal Sud", and any one of the square waves W1-W3 is referred to as a "square wave W".

Figure 16:
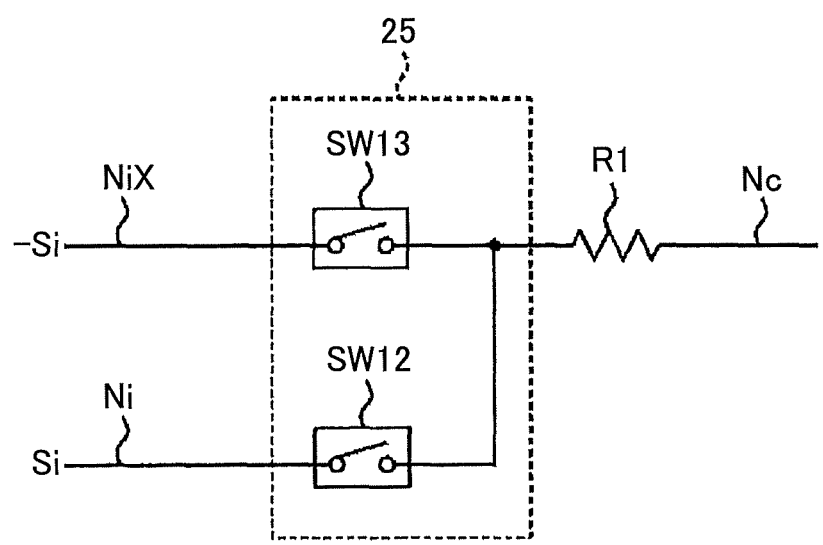
FIG. 16 is a drawing illustrating an example of a configuration of a square wave multiplication unit in a sine wave multiplication device according to the seventh embodiment.

FIG. 16 is a drawing illustrating an example of a configuration of a square wave multiplication unit UD. The square wave multiplication unit UD includes a resistor R1, a switch element SW12, and a switch element SW13. The switch element SW13 is provided on a current path between one end of the resistor R1 and an input node NiX that is connected to an output of the inverting amplifier circuit 60. The switch element SW12 is provided on a current path between the one end of the resistor R1 and the input node Ni. The other end of the resistor R1 is connected to the output node Nc. In one of the half cycles of a cycle of the square wave W, the switch element SW12 is turned ON and the switch element SW13 is turned OFF, and, in the other of the half cycles of the cycle, the switch element SW12 is turned OFF and the switch element SW13 is turned ON. In the following, in the present embodiment, an operation mode during a half cycle of the square wave W, in which the switch element SW12 is turned ON and the switch element SW13 is turned OFF, is referred to as a "non-inverting mode", and an operation mode during another half cycle of the square wave W, in which the switch element SW12 is turned OFF and the switch element SW13 is turned ON, is referred to as an "inverting mode".

In the non-inverting mode, the input node Ni is connected to the output node Nc via the resistor R1. Because the output node Nc is maintained at the reference potential according to a signal synthesis unit 10A that will be described later, a current output to the signal synthesis unit 10A from the square wave multiplication unit UD has a value proportional to a voltage of the input signal Si. The proportion of the output current with respect to the voltage of the input signal Si is a conductivity of the resistor R1.

In the inverting mode, on the other hand, the input node NiX is connected to the output node Nc via the resistor R1. In this case, because the output node Nc is maintained at the reference potential, a current output to the signal synthesis unit 10A from the square wave multiplication unit UD has a value proportional to a voltage of the inverted input signal −Si. The proportion of the output current with respect to the voltage of the inverted input signal −Si is a conductivity of the resistor R1.

The square wave multiplication unit UD1 (hereinafter, referred to as a "first square wave multiplication unit UD1") multiplies the input signal Si by the square wave W1 (hereinafter, referred to as a "first square wave W1") that has, as the fundamental wave, a sine wave having frequency fs. A frequency of the first square wave W1 is "fs", and an amplitude of the first square wave W1 is "A". The square wave multiplication units UD2, UD3 (hereinafter, referred to as a "second square wave multiplication unit UD2", a "second square wave multiplication unit UD3") multiply the input signal Si by square waves W2, W3 (hereinafter, referred to as a "second square wave W2", a "second square wave W3") that respectively have, as the fundamental waves, sine waves having inverted phases with respect to the third harmonic wave and the fifth harmonic wave included in the first square wave W1 having frequency fs. A frequency of the second square wave W2 is "3fs" and an amplitude is "A/3". A frequency of the second square wave W3 is "5fs" and an amplitude is "A/5".

When a conductivity of the resistor R1 in the first square wave multiplication unit UD1 is "Yu1", a conductivity of the resistor R1 in the second square wave multiplication unit UD2 is "Yu2", and a conductivity of the resistor R1 in the second square wave multiplication unit UD3 is "Yu3", ratios among the conductivities are set as represented by the following formula.

$$Yu1:Yu2:Yu3=15:5:3 \quad (4)$$

By setting the conductivities as shown in (4), an amplitude of a current component corresponding to the third harmonic wave of the first square wave W1 included in an output current of the first square wave multiplication unit UD1 becomes equal to an amplitude of a current component corresponding to the fundamental wave of the second square wave W2 included in an output current of the second square wave multiplication unit UD2. Further, an amplitude of a current component corresponding to the fifth harmonic wave of the first square wave W1 included in an output current of the first square wave multiplication unit UD1 becomes equal to an amplitude of a current component corresponding to the fundamental wave of the second square wave W3 included in an output current of the second square wave multiplication unit UD3.

The signal synthesis unit 10A generates an output signal So corresponding to a sum of currents output from the square wave multiplication units UD1-UD3. The signal synthesis unit 10A includes, for example, a resistor R3 and an amplifier circuit OP2 as illustrated in FIG. 15. The resistor R3 is connected between the output node Nc and an output of the amplifier circuit OP2. The amplifier circuit OP2 controls an output voltage at an end of the resistor R3 in such a way that the output node Nc is caused to be equal to the reference potential. The amplifier circuit OP2 is, for example, an operational amplifier, an inverting input terminal of which is connected to the output node Nc and a non-inverting input terminal of which is connected to the reference potential.

Figure 17:
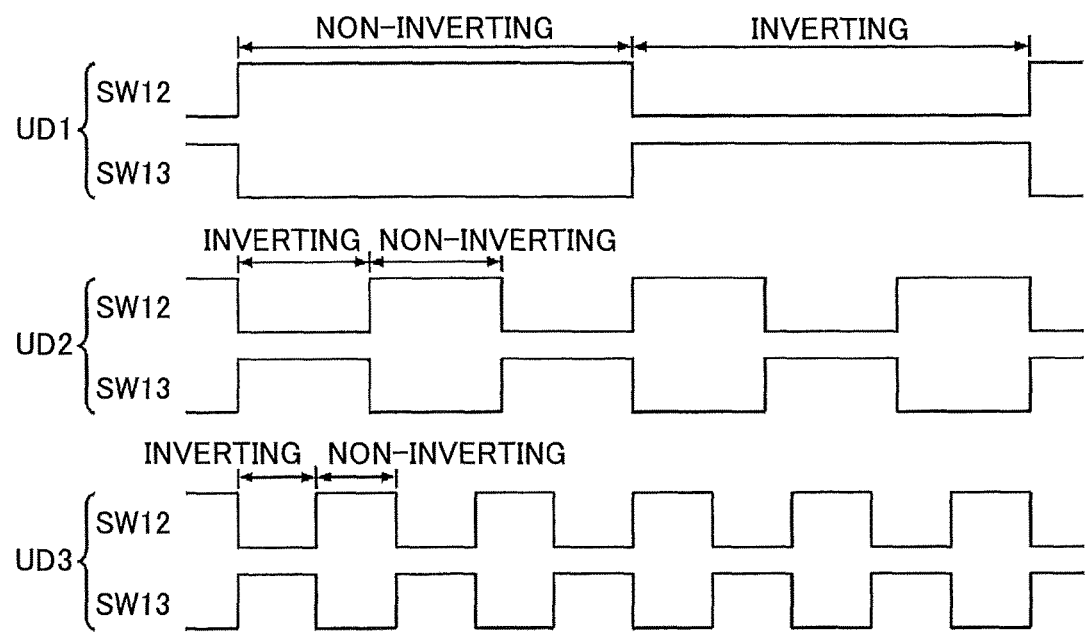
FIG. 17 is a timing chart illustrating ON/OFF states of switch elements of the square wave multiplication unit and a signal synthesis unit in the sine wave multiplication device according to the seventh embodiment.

FIG. 17 is a timing chart illustrating ON/OFF states of switch elements of the square wave multiplication units UD1-UD3. As illustrated in FIG. 17, during the time when a cycle of multiplication of the first square wave W1, composed of the non-inverting mode and the inverting mode, is performed by the first square wave multiplication unit UD1, three cycles of multiplication of the second square wave W2 are performed by the second square wave multiplication unit UD2 and five cycles of multiplication of the second square wave W3 are performed by the second square wave multiplication unit UD3.

Further, when the non-inverting mode of the first square wave W1 is started in the first square wave multiplication unit UD1, the inverting mode of the second square wave W2 is started in the second square wave multiplication unit UD2 and the inverting mode of the second square wave W3 is started in the second square wave multiplication unit UD3. Therefore, the fundamental wave of the second square wave W2 has an opposite phase with respect to the third harmonic wave of the first square wave W1, and the fundamental wave of the second square wave W3 has an opposite phase with respect to the fifth harmonic wave of the first square wave W1. Therefore, a current component corresponding to the third harmonic wave of the first square wave W1 included in an output current of the first square wave multiplication unit UD1 is canceled by a current component corresponding to the fundamental wave of the second square wave W2 included in an output current of the second square wave multiplication unit UD2. Further, a current component corresponding to the fifth harmonic wave of the first square wave W1 included in an output current of the first square wave multiplication unit UD1 is canceled by a current component corresponding to the fundamental wave of the second square wave W3 included in an output current of the second square wave multiplication unit UD3.

As described above, in the sine wave multiplication device according to the present embodiment, similar to other described embodiments, multiplication of the input signal Si by a sine wave can be performed accurately with a simpler configuration.

Eighth Embodiment

Next, referring to FIG. 18, an input device according to an eighth embodiment of the present invention will be described.

Figure 18:
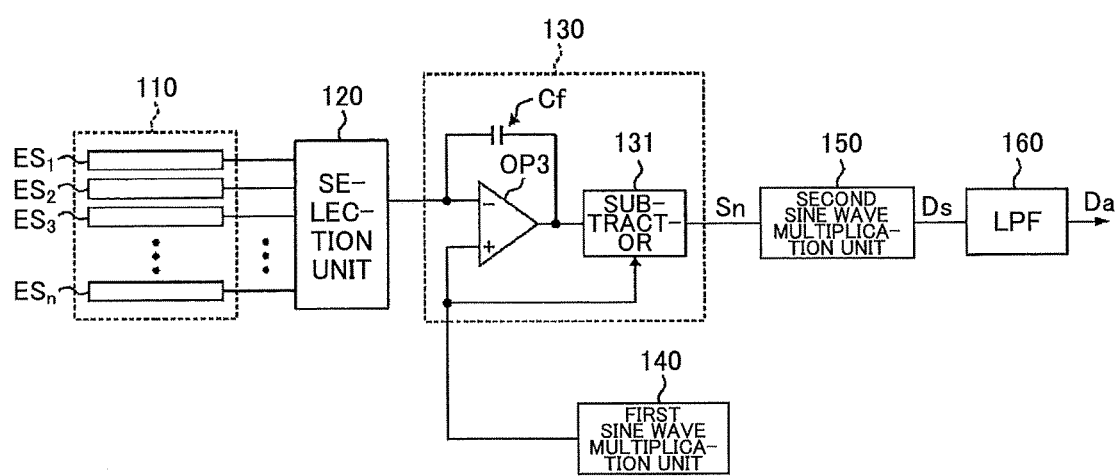
FIG. 18 is a drawing illustrating an example of a configuration of an input device according to an eighth embodiment of the present invention.

The input device according to the present embodiment illustrated in FIG. 18 is an input device such as a touch sensor used for inputting information corresponding to proximity of an object, and includes a sensor unit 110, a selection unit 120, a detection signal generation unit 130, a first sine wave multiplication unit 140, a second sine wave multiplication unit 150, and a low-pass filter 160.

The sensor unit 110 includes a sensor element whose capacitance changes according to proximity of an object. In an example of FIG. 18, the sensor unit 110 includes electrodes ES1-ESn that form capacitors between an object and the electrodes ES1-ESn. According to proximity of an object (e.g., a fingertip) to the electrodes ES1-ESn, capacitances of capacitors, formed between the electrodes ES1-ESn and the object, change.

The selection unit 120 selects one of the electrodes ES1-ESn in the sensor unit 110, and connects the selected electrode to an input of the detection signal generation unit 130.

The detection signal generation unit 130 applies a drive voltage, which has a sine wave corresponding to a first sine wave supplied by the first sine wave multiplication unit 140, to the electrode (ES1-ESn) of the sensor unit 110 selected by the selection unit 120, and generates a detection signal Sn corresponding to a current that flows in the electrode according to the application of the drive voltage. The detection signal generation unit 130 includes, for example, an operational amplifier OP3, a capacitor Cf, and a subtractor 131 as illustrated in FIG. 18. The capacitor Cf is connected between an inverting input terminal and an output terminal of the operational amplifier OP3. The first sine wave of the first sine wave multiplication unit 140 is input to a non-inverting input terminal of the operational amplifier OP3. The subtractor 131 subtracts the first sine wave from an output signal of the operational amplifier OP3, and outputs a subtraction result as a detection signal Sn. The detection signal Sn is a signal vibrating at frequency fs that is the same as the first sine wave. An amplitude of the detection signal Sn is proportional to the capacitance formed between the electrode of the sensor unit 110 and the object (fingertip).

The first sine wave multiplication unit 140 multiplies a DC (direct current) signal by a sine wave that has frequency fs, and outputs, as a result of the multiplication, the first sine wave that has a predetermined frequency. The first sine wave multiplication unit 140 has a configuration similar to, for example, the sine wave multiplication device illustrated in FIG. 12.

The second sine wave multiplication unit 150 multiplies the detection signal Sn generated by the detection signal generation unit 130 by a second sine wave having frequency fs, and has a configuration similar to, for example, the sine wave multiplication device illustrated in FIG. 10.

The low-pass filter 160 extracts a DC component signal Da from a signal Ds obtained as a multiplication result of the second sine wave multiplication unit 150. The second sine wave multiplication unit 150 and the low-pass filter 160 operate as a narrow-band bandpass filter that extracts a signal component having frequency fs included in the detection signal Sn.

The DC component signal Da has a level corresponding to a signal component having frequency fs included in the detection signal Sn, and is proportional to the capacitance formed between the electrode of the sensor unit 110 and the object (fingertip).

According to the input device according to the present embodiment, it is possible to obtain an accurate capacitance detection value, in which effects of external noise are removed, by using the first sine wave multiplication unit 140 and the second sine wave multiplication unit 150 that have simple configurations.

Several embodiments of the present invention have been described above. The present invention is not limited to these embodiments and further includes various variations.

Figure 19:
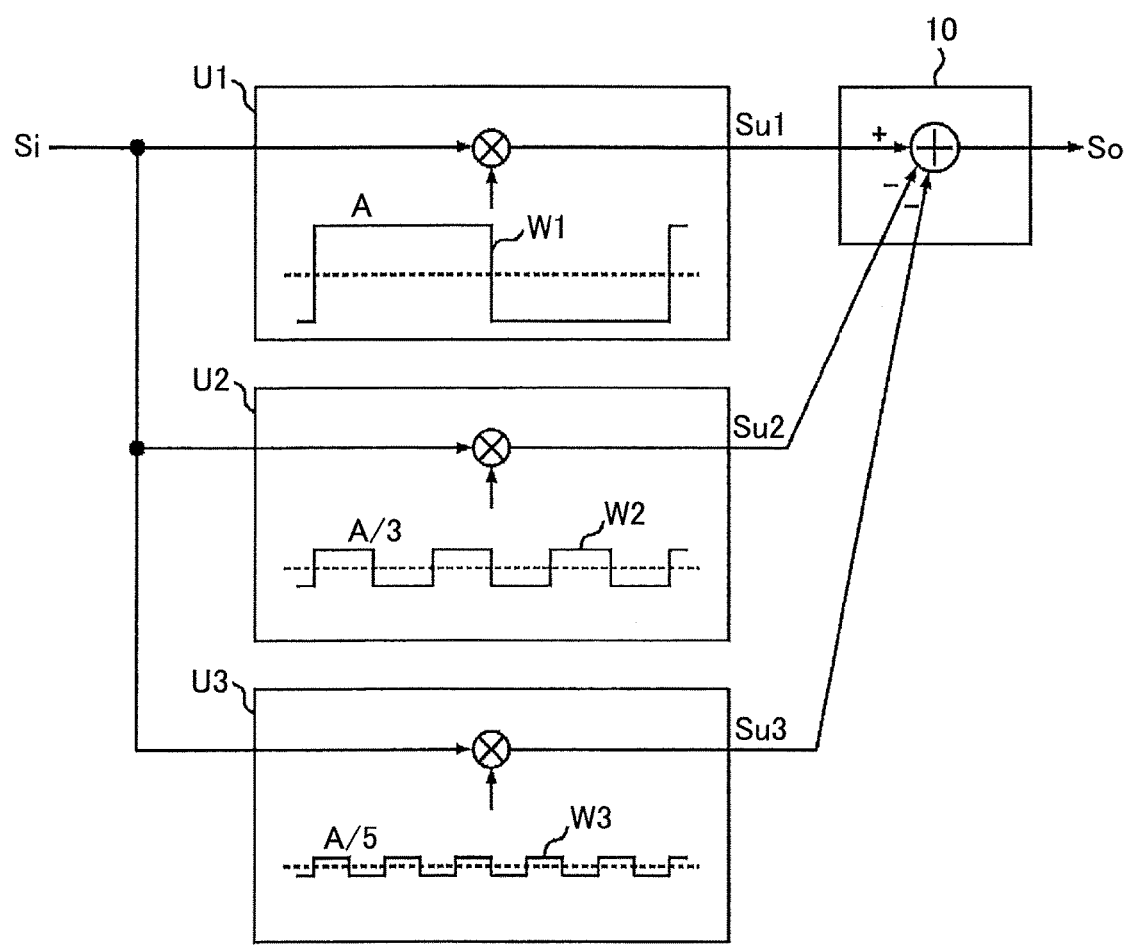
FIG. 19 is a drawing illustrating a modified example of a sine wave multiplication device according to the first embodiment.

In the sine wave multiplication device illustrated in FIG. 4, the fundamental waves of the second square wave W2, W3, by which the input signal Si is multiplied in the second square wave multiplication units U2, U3, have opposite phases with respect to the phases of the harmonic waves of the first square wave W1. However, the present invention is not limited to this example. In another embodiment of the present invention, as illustrated in FIG. 19, for example, the fundamental waves of the second square wave W2, W3, by which the input signal Si is multiplied in the second square multiplication units U2, U3, may have the same phases with respect to the phases of the harmonic waves of the first square wave W1. In this case, the signal synthesis unit 10 performs the signal synthesis in such a way that the output signals Su2, Su3 of the second square wave multiplication units U2, U3 are subtracted from the output signal Su1 of the first square wave multiplication unit U1, and thus, similar to the sine wave multiplication device illustrated in FIG. 4, the harmonic wave components can be canceled.

In the embodiment described above, signal components corresponding to the third harmonic wave and the fifth harmonic wave of the first square wave W1 are canceled by signal components corresponding to the fundamental waves of the second square waves W2, W3. The present invention is not limited to this example. In another embodiment of the present invention, the number of the square wave multiplication units may be three or more in order to, cancel signal components corresponding to the harmonic waves that have higher frequencies.

In the embodiment described above, an example has been listed in which signal processing is performed by using, as a reference, a signal level from the reference potential. However, in another embodiment of the present invention, a differential signal may be used. By using a differential signal, it is possible to reduce effects of disturbance such as power supply noise.

In the embodiment described above, an analog circuit is used for performing square wave multiplication processing and performing multiplication result synthesis processing. However, in another embodiment of the present invention, digital signal processing may be used for the above-described signal processing.

DESCRIPTION OF THE REFERENCE NUMERALS 10, 10A: signal synthesis unit
21, 21A: first switch unit
22: second switch unit
23: third switch unit
30: first low-pass filter
40: second low-pass filter
50, 160: low-pass filter
60: inverting amplifier U1-U3, UA1-UA3, UB1-UB3, UD1-UD3: square wave multiplication unit
SW1-SW10: switch element
OP1, OP2: amplifier circuit
C1-C4: capacitor
R1: resistor

What is claimed is:

1. A sine wave multiplication device that multiplies an input signal by a sine wave having a predetermined frequency, the sine wave multiplication device comprising:
    a plurality of square wave multiplication units that multiply the input signal by square waves having frequencies different from each other; and
    a signal synthesis unit that synthesizes output signals of the square wave multiplication units, wherein
    each of the square waves can be approximated as a sum of a fundamental wave that is a sine wave whose frequency is the lowest and a plurality of harmonic waves that are sine waves having frequencies of integer multiples of the fundamental wave,
    the square wave multiplication units include a single first square wave multiplication unit and one or more second square wave multiplication units,
    the first square wave multiplication unit multiplies the input signal by a first square wave that has, as the fundamental wave, a sine wave having the predetermined frequency,
    the second square wave multiplication unit multiplies the input signal by a second square wave that has, as the fundamental wave, a sine wave that is the same as one of the harmonic waves included in the first square wave or a sine wave whose phase is inverted from that of the one of the harmonic waves, and
    the signal synthesis unit cancels a signal component corresponding to a product of at least one of the harmonic waves of the first square wave included in an output signal of the first square wave multiplication unit and the input signal, by a signal component corresponding to a product of the fundamental wave of the second square wave included in an output signal of the second square wave multiplication unit and the input signal,
    wherein the square wave multiplication unit generates an output signal, which is proportional to the input signal, in each of one of the half cycles and the other of the half cycles in a cycle of the square wave by which the input signal is multiplied, wherein an absolute value of a ratio between the input signal and the output signal in one of the half cycles is the same as that of a ratio between the input signal and the output signal in the other of the half cycles, and wherein a sign of the ratio in one of the half cycles is opposite to that in the other of the half cycles,
    wherein, in each of the one of the half cycles and the other of the half cycles in a cycle of the square wave by which the input signal is multiplied, the square wave multiplication unit repeats, alternately at a predetermined sampling cycle, a charging operation for accumulating an electric charge proportional to a voltage of the input signal and an electric charge outputting operation for outputting the electric charge accumulated by the charging operation to the signal synthesis unit, wherein a ratio between the voltage of the input signal and an electric charge amount accumulated by the charging operation in the one of the half cycles is equal to that in the other of the half cycles, wherein polarity of the electric charge output to the signal synthesis unit in the one of the half cycles is opposite to that in the other of the half cycles, and
    wherein, every time when a predetermined number of electric charge outputting operations are performed, the signal synthesis unit generates a signal corresponding to a sum of the electric charges output from the square wave multiplication units according to the electric charge outputting operations.

2. The sine wave multiplication device according to claim 1,
    wherein the first square wave multiplication unit and the second square multiplication unit have at least one capacitor that accumulates an electric charge in the charging operation, and
    wherein
    a ratio between a capacitance of the capacitor in which an electric charge is accumulated in the charging operation by the first square wave multiplication unit and a capacitance of the capacitor in which an electric charge is accumulated in the charging operation by the second square wave multiplication unit, has a value corresponding to a ratio between an amplitude of the fundamental wave of the first square wave and an amplitude of the harmonic wave of the first square wave that has a frequency equal to the fundamental wave of the second square wave.

3. The sine wave multiplication device according to claim 1, the sine wave multiplication device further comprising: an input node to which the input signal is input; and
    an output node to which outputs of the square wave multiplication units are connected in common, wherein
    the square wave multiplication unit includes
    a first capacitor and a second capacitor,
    a first switch unit that repeats, alternately at the sampling cycle, a charging operation for connecting one end of the first capacitor to the input node and for connecting the other end of the first capacitor to a reference potential and an electric charge outputting operation for connecting the one end of the first capacitor to the output node and for connecting the other end of the first capacitor to the reference potential in one of the half cycles of a cycle of the square wave by which the input signal is multiplied, and
    a second switch unit that repeats, alternately at the sampling cycle, a charging operation for connecting one end of the second capacitor to the input node and for connecting the other end of the second capacitor to the reference potential and an electric charge outputting operation for connecting the other end of the second capacitor to the output node and for connecting the one end of the second capacitor to the reference potential in the other of the half cycles of a cycle of the square wave by which the input signal is multiplied, and
    the signal synthesis unit includes
    a third capacitor one terminal of which is connected to the output node,
    an amplifier circuit that controls a voltage of the other terminal of the third capacitor in such a way that a voltage difference between the output node and the reference potential is caused to be zero, and
    a discharging circuit that discharges an electric charge accumulated in the third capacitor every time when a predetermined number of the electric charge outputting operations are performed by the square wave multiplication units.

4. The sine wave multiplication device according to claim 3, wherein
the first switch unit includes
a first switch element that is provided on a current path between the input node and the one end of the first capacitor, and
a second switch element that is provided on a current path between the one end of the first capacitor and the output node,
the other end of the first capacitor is connected to the reference potential,
the second switch unit includes
a third switch element that is provided on a current path between the input node and the one end of the second capacitor,
a fourth switch element that is provided on a current path between the other end of the second capacitor and the reference potential,
a fifth switch element that is provided on a current path between the other end of the second capacitor and the output node, and
a sixth switch element that is provided on a current path between the one end of the second capacitor and the reference potential,
in one of the half cycles of a cycle of the square wave by which the input signal is multiplied,
the first switch element is turned ON and the other switch elements are turned OFF at the time of the charging operation,
the second switch element is turned ON and the other switch elements are turned OFF at the time of the electric charge outputting operation, and
in the other of the half cycles of a cycle of the square wave by which the input signal is multiplied,
the third switch element and the fourth switch element are turned ON and the other switch elements are turned OFF at the time of the charging operation, and
the fifth switch element and the sixth switch element are turned ON and the other switch elements are turned OFF at the time of the electric charge outputting operation.

5. The sine wave multiplication device according to claim 4, wherein
the square wave multiplication unit includes a fourth capacitor that is provided on a current path between the first switch element and the input node,
the first switch unit includes
a seventh switch element that is provided on a current path between one end of the fourth capacitor and the input node,
a eighth switch element that is provided on a current path between the one end of the fourth capacitor and the reference potential, and
a ninth switch element that is provided on a current path between the other end of the fourth capacitor and the reference potential,
the seventh switch element is turned ON or OFF under the same condition as the first switch element,
the eighth switch element and the ninth switch element are turned ON or OFF under the same conditions as the second switch element.

6. The sine wave multiplication device according to claim 1, the sine wave multiplication device further comprising:
a first low-pass filter that attenuates a noise component, included in the input signal that is input to the square wave multiplication units, that may generate aliasing noise into a signal band of the input signal from a frequency that is integer multiple of the sampling frequency.

7. The sine wave multiplication device according to claim 1, the sine wave multiplication device further comprising:
N number of the square wave multiplication units that multiply the input signal by N patterns of the second square waves corresponding to the first to Nth harmonic waves, in order from lowest frequency, included in the first square wave; and
a second low-pass filter that attenuates the (N+1)th harmonic wave and the following harmonic waves, in order from lowest frequency, included in the first square wave in a signal output as a synthesis result by the signal synthesis unit.

8. An input device used for inputting info Illation corresponding to proximity of an object, the input device comprising:
a sensor unit that includes a sensor element whose capacitance is changed according to the proximity of the object;
a first sine wave multiplication unit that multiplies a direct current signal by a sine wave having a predetermined frequency and outputs a first sine wave having the predetermined frequency as a result of the multiplication;
a detection signal generation unit that applies a drive voltage of a sine wave corresponding to the first sine wave, and generates a detection signal corresponding to a current that flows in the sensor element according to the application of the drive voltage;
a second sine wave multiplication unit that multiplies the detection signal by a second sine wave having the predetermined frequency; and
a low-pass filter that extracts a direct current component from a signal of the multiplication result of the second sine wave multiplication unit, wherein
the first sine wave multiplication unit and the second sine wave multiplication unit are the sine wave multiplication device according to claim 1.

* * * * *